(12) United States Patent
Hayashi et al.

(10) Patent No.: US 7,605,017 B2
(45) Date of Patent: Oct. 20, 2009

(54) METHOD OF MANUFACTURING A SEMICONDUCTOR DEVICE AND PRODUCTS MADE THEREBY

(75) Inventors: Tetsuya Hayashi, Yokosuka (JP); Masakatsu Hoshi, Yokohama (JP); Hideaki Tanaka, Yokohama (JP); Shigeharu Yamagami, Yokohama (JP)

(73) Assignee: Nissan Motor Co., Ltd., Yokohama-shi, Kanagawa (JP)

(*) Notice: Subject to any disclaimer, the term of this patent is extended or adjusted under 35 U.S.C. 154(b) by 0 days.

(21) Appl. No.: 11/870,561

(22) Filed: Oct. 11, 2007

(65) Prior Publication Data

US 2008/0121933 A1 May 29, 2008

(30) Foreign Application Priority Data

Nov. 24, 2006 (JP) .............................. 2006-316807

(51) Int. Cl.
*H01L 21/00* (2006.01)
*H01L 21/338* (2006.01)
*H01L 21/337* (2006.01)
*H01L 21/8249* (2006.01)

(52) U.S. Cl. .............................. 438/81; 438/92; 438/93; 438/94; 438/167; 438/172; 438/181; 438/186; 438/188; 438/191; 438/235; 257/E21.066; 257/E21.403

(58) Field of Classification Search .......... 257/E21.006, 257/E21.403
See application file for complete search history.

(56) References Cited

U.S. PATENT DOCUMENTS 7,282,739 B2 * 10/2007 Kaneko ..................... 257/77

| | | | |
|---|---|---|---|
| 2004/0217358 A1 | 11/2004 | Kaneko | |
| 2006/0060917 A1* | 3/2006 | Hayashi et al. | 257/330 |
| 2006/0223274 A1* | 10/2006 | Shimoida et al. | 438/312 |
| 2007/0221955 A1* | 9/2007 | Shimoida et al. | 257/194 |
| 2007/0252168 A1* | 11/2007 | Shimoida et al. | 257/147 |
| 2007/0262324 A1* | 11/2007 | Kaneko | 257/77 |

FOREIGN PATENT DOCUMENTS

| EP | 1 519 419 A2 | 3/2005 |
|---|---|---|
| EP | 1 641 030 A2 | 3/2006 |
| JP | 2003-318398 A | 7/2003 |

* cited by examiner

*Primary Examiner*—Savitri Mulpuri
*Assistant Examiner*—Mohsen Ahmadi
(74) *Attorney, Agent, or Firm*—Young Basile

(57) ABSTRACT

Methods of manufacturing a semiconductor device and resulting products. The semiconductor device includes a semiconductor substrate, a hetero semiconductor region hetero-adjoined with the semiconductor substrate, a gate insulation layer contacting the semiconductor substrate and a heterojunction of the hetero semiconductor region, a gate electrode formed on the gate insulation layer, an electric field alleviation region spaced apart from a heterojunction driving end of the heterojunction that contacts the gate insulation layer by a predetermined distance and contacting the semiconductor substrate and the gate insulation layer, a source electrode contacting the hetero semiconductor region and a drain electrode contacting the semiconductor substrate. A mask layer is formed on the hetero semiconductor region, and the electric field alleviation region and the heterojunction driving end are formed by using at least a portion of the first mask layer.

14 Claims, 14 Drawing Sheets

METHOD OF MANUFACTURING A SEMICONDUCTOR DEVICE AND PRODUCTS MADE THEREBY

CROSS-REFERENCE TO RELATED APPLICATION

This application claims priority from Japanese Patent Application Serial No. 2006-316807, filed Nov. 24, 2006, which is incorporated herein in its entirety by reference.

TECHNICAL FIELD

The invention relates in general to a method of manufacturing a semiconductor device having a hetero semiconductor region, which is hetero-adjoined to a semiconductor substrate.

BACKGROUND

Japanese Laid-Open Patent Publication No. 2003-318398 discloses a semiconductor device having an N$^-$-type polycrystalline silicon region, which is formed and adjoined to a main surface of a semiconductor substrate. The semiconductor substrate has an N$^+$-type silicon carbide substrate on which an N$^-$-type silicon carbide epitaxial region is formed. In this semiconductor device, the N$^-$-type silicon carbide epitaxial region and the N$^-$-type polycrystalline silicon region are hetero-adjoined to each other. Further, a gate electrode is formed adjacent to a heterojunction of the N$^-$-type silicon carbide epitaxial region and the N$^-$-type polycrystalline silicon region by using a gate insulation layer. The N$^-$-type polycrystalline silicon region is connected to a source electrode through a source contact hole formed in an interlayer dielectric. A drain electrode is formed on the other surface of the N$^-$-type silicon carbide substrate.

Such a semiconductor device functions as a switch by controlling an electric potential of the gate electrode when the source electrode is grounded and a predetermined positive electric potential is applied to the drain electrode. That is, when the gate electrode is grounded, a reverse bias is applied to the heterojunction of the N$^-$-type polycrystalline silicon region and the N$^-$-type silicon carbide epitaxial region such that no electric current flows between the drain and the source electrodes. However, when a predetermined positive voltage is applied to the gate electrode, a gate electric field is applied to the heterojunction interface of the N$^-$-type polycrystalline silicon region and the N$^-$-type silicon carbide epitaxial region. Since the thickness of an energy barrier ($\Delta$Ec) defined by the heterojunction of a gate oxide film interface is reduced, the current can flow between the drain electrode and the source electrode. In addition, this semiconductor device uses the heterojunction as a control channel for interrupting and conducting the current. Thus, the thickness of a hetero barrier functions as a length of the channel, and conductivity with a low resistance can be obtained. A resistance can be lowered as the intensity of the gate electric field increases in the heterojunction interface of the N$^-$-type polycrystalline silicon region and the N$^-$-type silicon carbide epitaxial region where the gate electrode is adjoined using the gate insulation layer.

BRIEF SUMMARY

Methods of manufacturing a semiconductor device are taught herein. One such semiconductor device includes a semiconductor substrate, a hetero semiconductor region formed of a semiconductor material having a band gap width different from that of the semiconductor substrate and hetero-adjoined with the semiconductor substrate, a gate insulation layer contacting the semiconductor substrate and a heterojunction of the hetero semiconductor region, a gate electrode formed on the gate insulation layer, a first electric field alleviation region spaced apart from a heterojunction driving end of the heterojunction that contacts the gate insulation layer by a predetermined distance and contacting the semiconductor substrate and the gate insulation layer, a source electrode contacting the hetero semiconductor region and a drain electrode contacting the semiconductor substrate. The method according to this example comprises forming a first mask layer on the hetero semiconductor region and forming the first electric field alleviation region and the heterojunction driving end using at least a portion of the first mask layer.

BRIEF DESCRIPTION OF DRAWINGS

The description herein makes reference to the accompanying drawings wherein like reference numerals refer to like parts throughout the several views, and wherein.

DETAILED DESCRIPTION OF EMBODIMENTS OF THE INVENTION

In semiconductor devices such as that disclosed in Japanese Laid-Open Patent Publication No. 2003-318398, the current leaks at the heterojunction of the $N^-$-type polycrystalline silicon region and the $N^-$-type silicon carbide epitaxial region due to the barrier height when the current is interrupted. Therefore, the semiconductor device has a limitation in reducing the leakage current when the current is interrupted. In contrast, exemplary embodiments of the invention taught herein provide a semiconductor device designed to reduce the leakage current.

A semiconductor device manufactured according to a semiconductor manufacturing method of a first exemplary embodiment is described with reference to the cross-sectional view of FIG. 1.

In this example, a semiconductor device is configured such that two unit cells of a field-effect transistor (FET) are disposed so as to face each other. Further, one transistor is actually formed of a plurality of unit cells of the FET, which are arranged in parallel.

Figure 1:
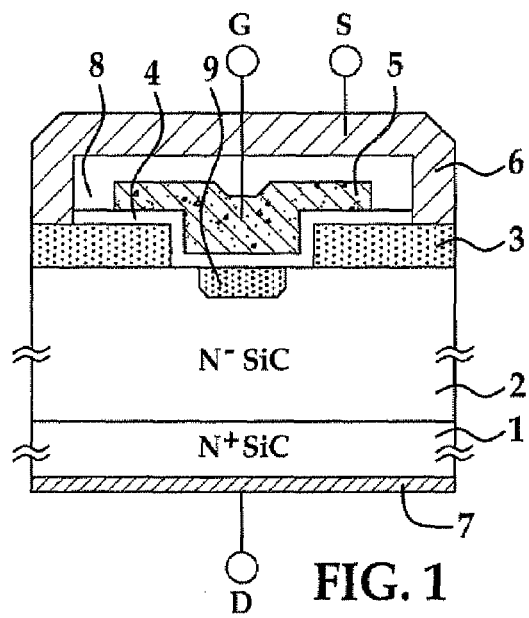
FIG. 1 is a cross-sectional view of a semiconductor device constructed in accordance with a first exemplary embodiment.

The semiconductor device of FIG. 1 includes a substrate region 1 defined by a semiconductor substrate and a drift region 2. The substrate region 1 is formed of an $N^+$-type (high density) silicon carbide whose poly type is 4H. The drift region 2 formed of an $N^-$-type (low density) silicon carbide is formed on a surface of the substrate region 1.

The semiconductor device of FIG. 1 includes, for each cell of the FET, a first hetero semiconductor region 3 formed on a predetermined area of a surface of the drift region 2, which region 3 faces a junction surface of the drift region 2 and the substrate region 1. A gate insulation layer 4 is formed on a surface of the drift region 2, i.e., a surface (including a side surface) of the first hetero semiconductor region 3 and adjoined to the heterojunction of the drift region 2 and the first hetero semiconductor region 3. A gate electrode 5 is formed adjacent to the gate insulation layer 4. A source electrode 6 ohmic-contacts a surface of the hetero semiconductor region 3 and faces the junction of the first hetero semiconductor region 3 and the drift region 2, and a drain electrode 7 is ohmic-connected to the other surface of the substrate region 1. An interlayer dielectric 8 insulates the source electrode 5 from the gate electrode 6. Further, there is provided a P-type gate electric field alleviation region 9 (a first electric field alleviation region) that is spaced apart from a hetero junction driving end adjoined to the gate insulation layer 4 in the hetero junction of the first hetero semiconductor region 3 and the drift region 2 and is formed in the drift region 2 contacting the gate insulation layer 4 under the gate electrode 5.

Here, the first hetero semiconductor region 3 related to the first exemplary embodiment is formed of N-type polycrystalline silicon having a band gap width different from the drift region 2 and hetero-adjoined with the drift region 2. Thus, an energy barrier $\Delta Ec$ is formed on a heterojunction interface of the drift region 2 and the first hetero semiconductor region 3. Further, the gate insulation layer 4 is formed of a silicon oxide film.

A method of manufacturing the semiconductor device of FIG. 1 is next described with reference to the sectional views of FIGS. 2A-2D and 3A-3C.

Figure 2A:
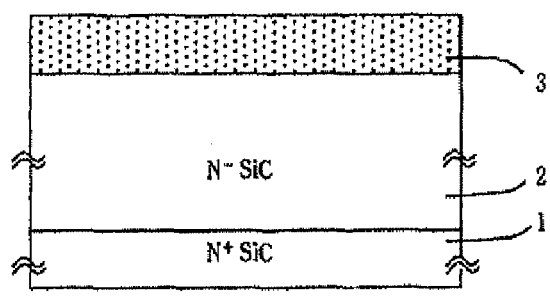
FIGS. 2A-2D illustrate processes of manufacturing the semiconductor device of FIG. 1.

First, as shown in FIG. 2A, an N-type silicon carbide substrate is formed on the $N^+$-type substrate region through the epitaxial growth of the $N^-$-type drift region 2. Next, a polycrystalline silicon layer is formed on the N-type silicon carbide semiconductor substrate through, for example, a low-pressure chemical vapor deposition (LP-CVD) process. Then, the first N-type hetero semiconductor region 3 is formed by implanting impurities such as phosphor and arsenic in the polycrystalline silicon layer through, for example, an ion-implantation process.

Figure 2B:
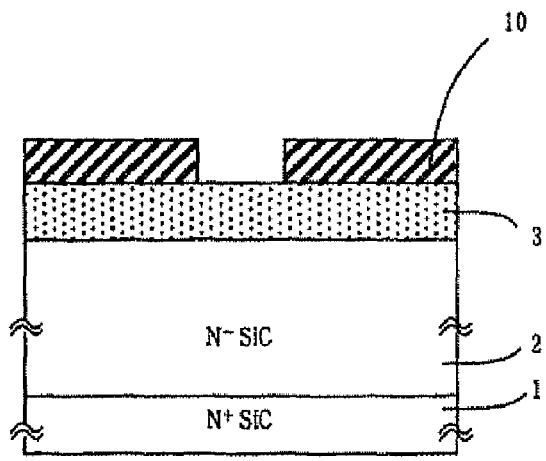

After the above, as shown in FIG. 2B, a first mask layer 10 is formed on the first hetero semiconductor region 3 by patterning, for example, a CVD oxide layer through a photolithography.

Figure 2C:
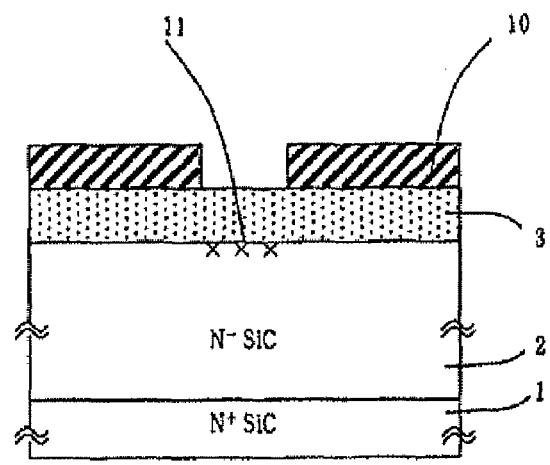

Next, as shown in FIG. 2C, a first impurity region 11 is formed in the drift region 2 by implanting impurities such as boron or aluminum in a portion of the drift region 2 not covered by the first mask layer 10. The first impurity region 11 is formed by, for example, an ion implantation process when the first hetero semiconductor region 3 is interposed between the first mask 10 and the drift region 2.

Figure 2D:
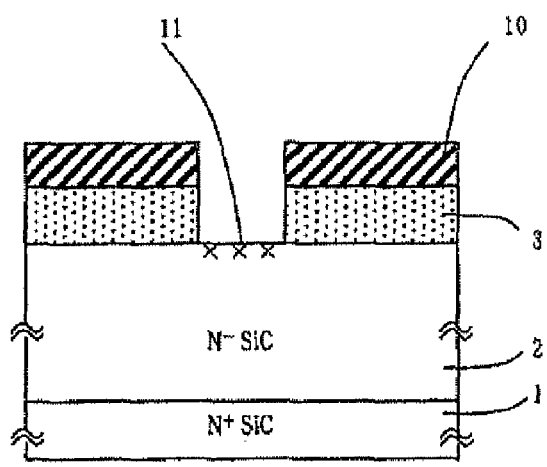

Thereafter, as shown in FIG. 2D, a portion of the first hetero semiconductor region 3 not covered by the first mask layer 10 is etched through, for example, a reactive ion etching (dry-etching) process.

Figure 3A:
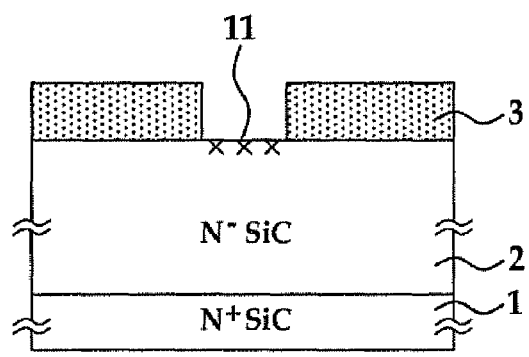
FIGS. 3A-3C illustrate processes subsequent to the processes of FIGS. 2A-2D.

After the above, as shown in FIG. 3A, the first mask layer 10 is removed through a wet-etching process by using a mixture solution of ammonium fluoride and hydrogen fluoride, for example.

Figure 3B:
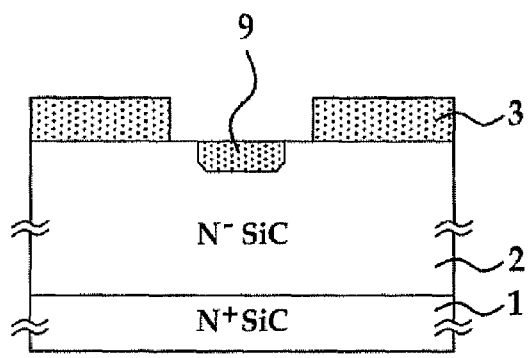

Next, as shown in FIG. 3B, a portion of the hetero semiconductor region 3 is oxidized with a predetermined thickness through, for example, a dry $O_2$ oxidizing process. At the same time, the first impurity region 11 is activated to form the electric field alleviation region 9. Then, the oxidized portion of the first hetero semiconductor region 3 is isotropically etched through a wet-etching process by using a mixture solution of ammonium fluoride and hydrogen fluoride.

By forming the first hetero semiconductor region 3 and the electric field alleviation region 9 using the first mask layer 10, all of the unit cells are formed and uniformly spaced apart from each other.

Figure 3C:
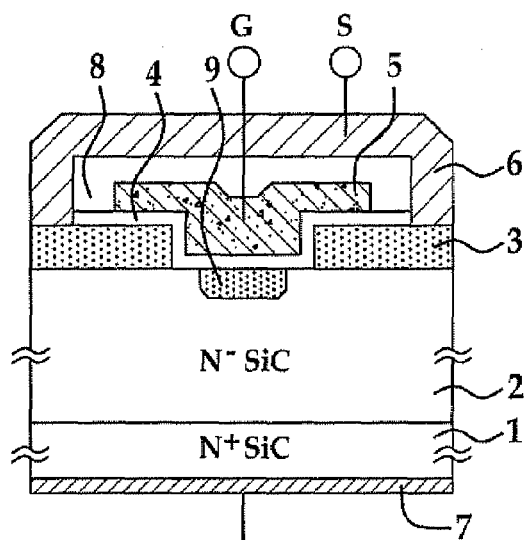

Finally, as shown in FIG. 3C, the gate insulation layer 4 and the polycrystalline silicon layer are consecutively formed on a portion of the drift region 2, which is exposed by the arrangement of the first hetero semiconductor region 3. The gate insulation layer 4 and the polycrystalline silicon layer are formed by, for example, an LP-CVD process. Further, impurities such as phosphor or arsenic are implanted in the polycrystalline silicon layer through, for example, an ion implantation process, thereby forming the N-type gate electrode 5.

Also, the gate electrode 5 is patterned by using a mask layer, and an interlayer dielectric 8 is formed on the gate insulation layer 4 and the gate electrode 5 through, for example, a CVD process.

In addition, the drain electrode 7 is formed of, for example, titanium and nickel, on the other surface of the substrate region 1. Regardless of the order, the source electrode 6 is formed of, for example, titanium and aluminum, and contacts the interlayer dielectric 8, the gate insulation layer 4 and the first hetero semiconductor region 3. Thus, the semiconductor device related to the first exemplary embodiment of FIG. 1 is completed.

In the semiconductor device related to the first exemplary embodiment described above, since the electric field alleviation region 9 for reducing the leakage current is formed by self-alignment at a portion spaced apart from the heterojunction driving end to which the gate electric field is applied, excellent on-resistance can be obtained, and the leakage current can be reduced.

Further, in the first exemplary embodiment, since the heterojunction driving end and the electric field alleviation region 9 are formed by using the first mask layer 10 through a thermal-oxidizing process that can easily control the thickness, the heterojunction driving end and the electric field alleviation region 9 can be formed with an optimum distance from each other through self-alignment.

When the semiconductor device is designed to have a plurality of the described unit cells, a distance between the heterojunction driving end and the field alleviation region 9 are uniformly formed in all of the unit cells, thereby improving reliability.

Next described is operation of the semiconductor device constructed according to the first exemplary embodiment.

In the semiconductor device, the source electrode 6 is grounded, and a positive potential is applied to the drain electrode 7. When the gate electrode 5 is in, for example, a ground or negative potential, the current interruption state is maintained. That is, since the energy barrier ΔEc with respect to the conductive electrons is formed at the heterojunction interface of the first hetero semiconductor region 3 and the drift region 2, the current interruption state is maintained.

In the current interruption state, current leakage at the heterojunction interface is generated depending on the height of the energy barrier ΔEc and an intensity of the drain electric field. In this exemplary embodiment, the electric field alleviation region 9 is formed at a portion deeper than the heterojunction driving end, and the reverse bias is applied to the junction of the electric field alleviation region 9 and the drift region 2. Thus, a depletion layer is mainly grown from the junction of the electric field alleviation region 9 and the drift region 2 toward the drift region 2. Since the drain electric field around the hetero junction driving end can be alleviated by the depletion layer grown from the field alleviation region 9, the leakage current can be reduced.

Further, the higher leakage current reduction effect can be obtained as the depth of the electric field alleviation region 9 increases.

Next, when the positive potential is applied to the gate electrode 5 to change the current interruption state into the conduction state, a gate electric field is applied to the surfaces of the heterojunction driving end of the first hetero semiconductor region 3. Thus, the drift region 2 through the gate insulation layer 4 and an electron storage layer is formed on the surfaces of the heterojunction driving end and the surfaces.

Then, the surfaces of the first hetero semiconductor region 3 and the drift region 2 are in a potential state where free electrons can exist. In addition, the energy barrier ΔEc grown toward the drift region 2 is steeply reduced. Thus, the thickness of the energy barrier ΔEc is reduced. As a result, the electron current can flow.

In addition, in the first exemplary embodiment, although the electric field alleviation region 9 is formed to further reduce the leakage current in the current interruption state, there is a need for the electric field alleviation region 9 not to interfere with a current conduction property in the current conduction state. That is, when the heterojunction driving end to which the gate electric field is applied is too close to the electric field alleviation region 9, a desired conduction property may not be obtained in the conduction state. When the heterojunction driving end to which the gate electric field is applied is too far from the electric field alleviation region 9, the leakage current reduction effect deteriorates.

Thus, by using the method of manufacturing the semiconductor device in accordance with the first exemplary embodiment, the leakage current can be reduced in the current interruption state. In addition, the electric field alleviation region 9 can be easily formed through self-alignment on a location where the higher conduction property can be obtained in the current conduction state.

Further, even when the device is designed to have a plurality of unit cells, a distance between the heterojunction driving end and the electric field alleviation region 9 is uniformly formed in all of the unit cells. Thus, the current flow path in the current conduction state and the electric field distribution in the current interruption state are uniformly formed. Therefore, since an alternation does not easily occur in the surface in either the current interruption state or the current conduction state, the reliability and basic performance of the semiconductor device designed to have the plurality of the unit cells can be improved.

Next, when the gate electrode 5 is grounded to change the current interruption state into the current conduction state, the conductive electron storage state formed on the heterojunction interface of the first hetero semiconductor region 3 and the drift region 2 is released. Thus, the tunneling in the energy barrier ΔEc is stopped. Further, the conductive electron flow from the first hetero semiconductor region 3 toward the drift region is stopped, and the conductive electrons in the drift region 2 fully flow to the substrate region 1. Then, the depletion layer is grown from the hetero junction toward the drift region 2. Thus, the current interruption state is provided.

Further, due to the depletion layer grown from the electric field alleviation region 9, the drain electric field widened around the heterojunction driving end is alleviated. Thus, the leakage current is reduced in the current interruption state.

Also, the semiconductor device constructed according to the first exemplary embodiment provides a reverse conduction (a return current) where the source electrode 6 is grounded, and the negative potential is applied to the drain electrode 7. When the source and gate electrodes 6, 5 are set as the ground potential, and a predetermined negative potential is applied to the drain electrode 7, the energy barrier ΔEc against the conductive electrons disappears. The conductive electrons flow from the drift region 2 toward the first hetero semiconductor region 3, thereby providing the reverse current conduction state. In this reverse current conduction state, no electron hole exists, and the conduction is made by only the conductive electrons. Therefore, when the reverse current conduction state changes to the current interruption state, the loss caused by a reverse recovering current can be reduced.

Further, the gate electrode 5 can be used as a control electrode without being grounded.

Figure 4A:
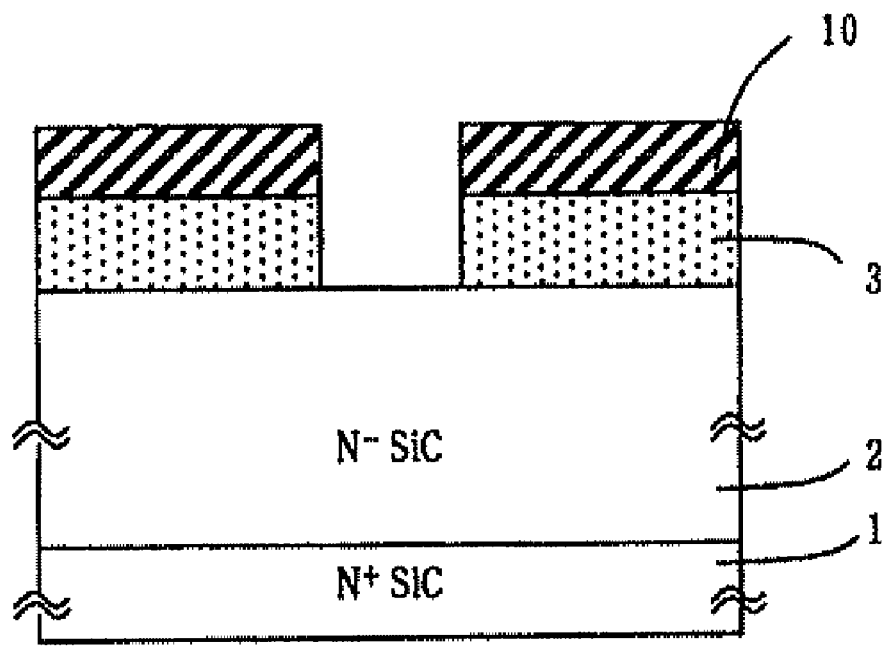
FIGS. 4A and 4B illustrate a method of manufacturing a semiconductor device in accordance with a second exemplary embodiment.
Figure 4B:
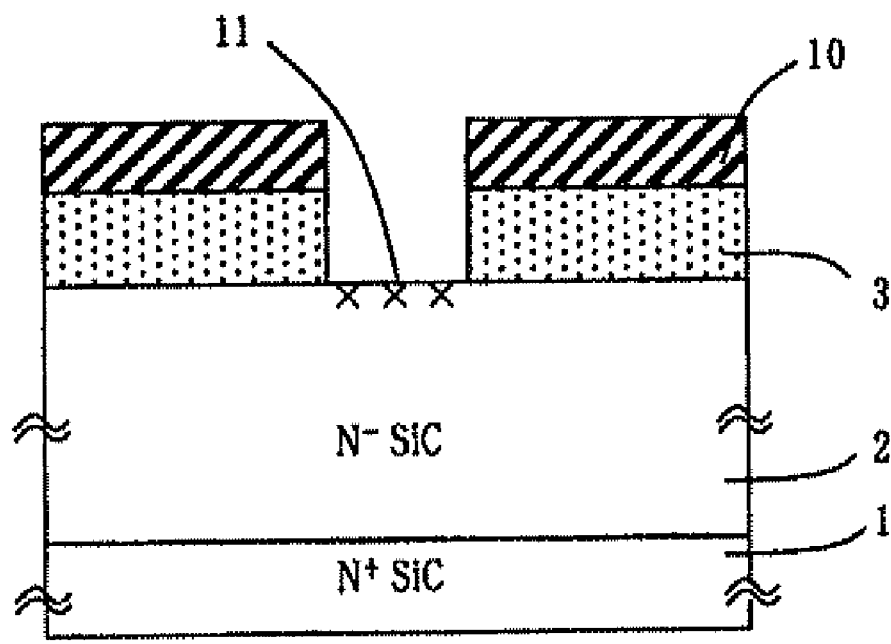

The following describes a method of a semiconductor device according to a second exemplary embodiment with reference to FIGS. 4A and 4B. A semiconductor device manufactured by this method has a configuration identical to that of the semiconductor device as shown in FIG. 1.

Unlike the method of the first exemplary embodiment, in the method of the second exemplary embodiment of FIGS. 4A and 4B, a process of etching a portion of the first hetero semiconductor region 3 not covered by the first mask layer 10 is performed before a process of forming the first impurity region 11.

In more detail, after the process depicted in FIG. 2B, a portion of the first hetero semiconductor region 3 not covered by the first mask layer 10 is etched through, for example, a reactive ion-etching (dry-etching) process as shown in FIG. 4A. Next, as shown in FIG. 4B, a first impurity region 11 is formed in a portion of the drift region 2 not covered by the first mask layer 10 by implanting impurities such as boron or aluminum through an ion implantation process. Finally, similar to the first exemplary embodiment, the processes depicted in FIGS. 3A-3C are performed to complete the semiconductor device of FIG. 1.

As described above, even when the order of forming the first hetero semiconductor region 3 and the first impurity region 11 is reversed, the semiconductor device of FIG. 1 can be easily manufactured. Further, the second exemplary embodiment can achieve the same effects as the first exemplary embodiment.

Figure 5A:
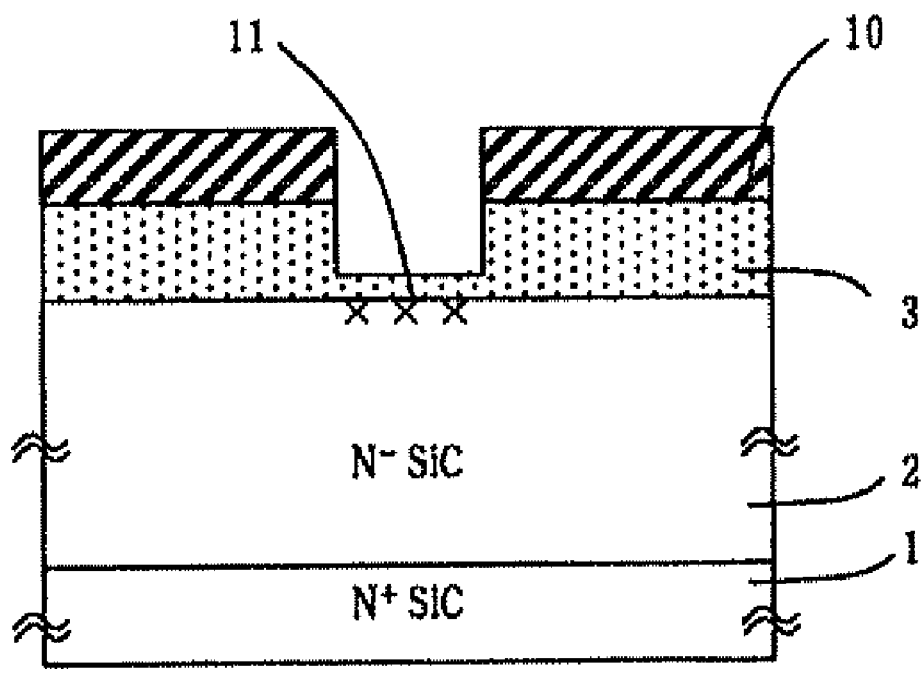
FIGS. 5A and 5B illustrate a method of manufacturing a semiconductor device in accordance with a third exemplary embodiment.
Figure 5B:
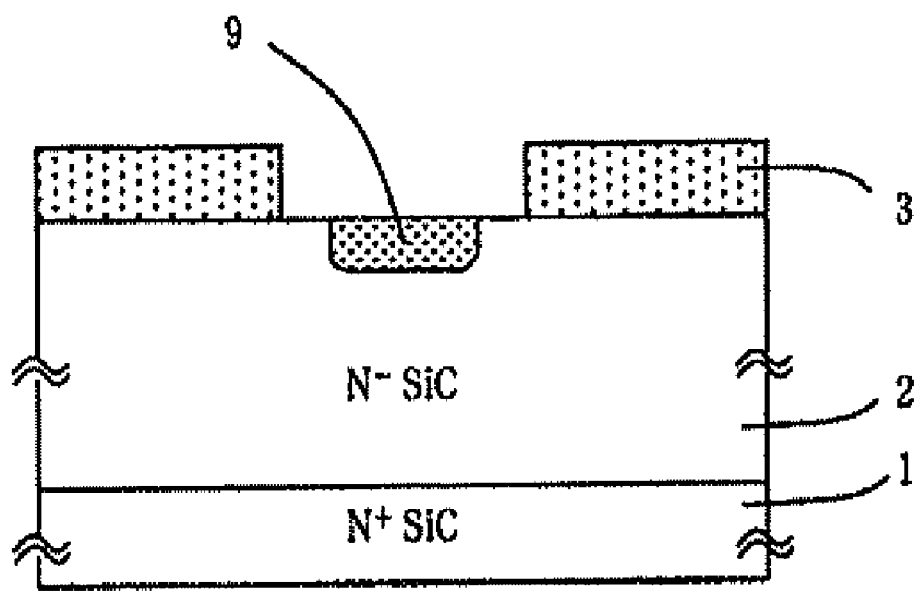

Next described is a method of a semiconductor device according to a third exemplary embodiment with reference to FIGS. 5A and 5B. A semiconductor device manufactured by this method has a configuration identical to that of FIG. 1.

Unlike the methods of the first and second exemplary embodiments, in the method of the third exemplary embodiment shown in FIGS. 5A and 5B, a process of etching a portion of the first hetero semiconductor region 3 not covered by the first mask layer 10 is performed such that a portion of the area that is etched remains with a slight predetermined thickness.

More specifically, after the process of FIG. 2C, a portion of the first hetero semiconductor region 3 not covered by the first mask layer 10 is etched through, for example, a reactive ion-etching (dry-etching) process such that a portion of the area that is etched remains with a slight predetermined thickness as shown in FIG. 5A. Next, as shown in FIG. 5B, the first mask layer 10 is removed through a wet-etching process by using a mixture solution of ammonium fluoride and hydrogen fluoride, after which the surface of the first hetero semiconductor region 3 is oxidized through a dry $O_2$ oxidizing process. Accordingly, a non-etched portion remains in the process of FIG. 5A, and an etched portion is oxidized with a predetermined thickness.

At the same time, the first impurity region 11 is activated, and the electric field alleviation region 9 is formed under the gate electrode.

Next, the oxidized portion of the first hetero semiconductor region 3 is isotropically etched through a wet-etching process by using ammonium fluoride and hydrogen fluoride.

Finally, similar to the first exemplary embodiment, the process depicted in FIG. 3C is performed to complete the semiconductor device of FIG. 1.

Thus, the electric field alleviation region 9 can be formed to be spaced apart from an end of the first hetero semiconductor region 3 by a predetermined distance.

Further, the third exemplary embodiment can achieve the same effects as the first exemplary embodiment. Also, since a portion of the first hetero semiconductor region 3 is etched such that a portion of the area that is etched is slightly left with a predetermined thickness through the dry-etching process having a high etching selection ratio, and the remained portion is oxidized through a thermal-oxidizing process capable of removing a damage, no plasma damage occurs on the heterojunction driving end or the surface of the drift region 2. Thus, a micro-process becomes possible. Therefore, in the current conduction state, since the termination of the electric field caused by damage does not occur, an enhanced conduction property can be achieved.

The following describes a method of a semiconductor device according to a fourth exemplary embodiment with reference to FIGS. 6A-6D. A semiconductor device manufactured by this method has a configuration identical to that of the semiconductor device according to FIG. 1.

Unlike the methods of the first to third exemplary embodiments, in the method of the fourth exemplary embodiment shown in FIGS. 6A-6D, the heterojunction driving end is formed after an aperture of the first mask layer 10 is enlarged.

Figure 6A:
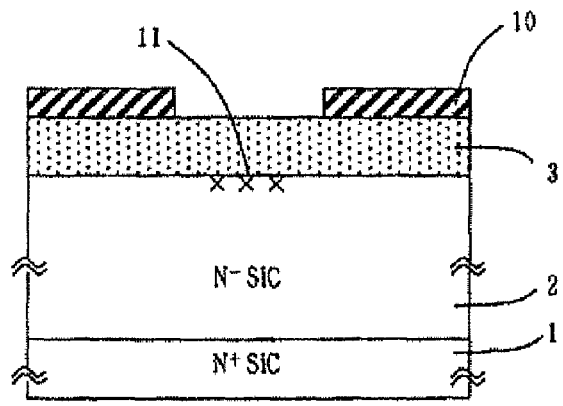
FIGS. 6A-6D illustrate a method of manufacturing a semiconductor device in accordance with a fourth exemplary embodiment.

More specifically, after the process of FIG. 2C, an aperture of the first mask layer 10 is enlarged by isotropically etching the first mask layer 10 by a predetermined thickness through a wet-etching process as shown in FIG. 6A. The wet-etching process uses, for example, a mixture solution of ammonium fluoride and hydrogen fluoride.

Figure 6B:
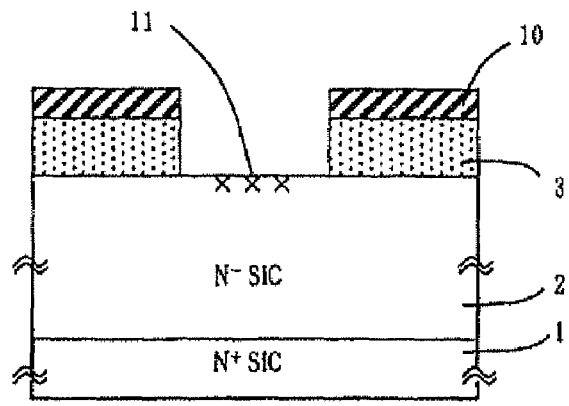
Figure 6C:
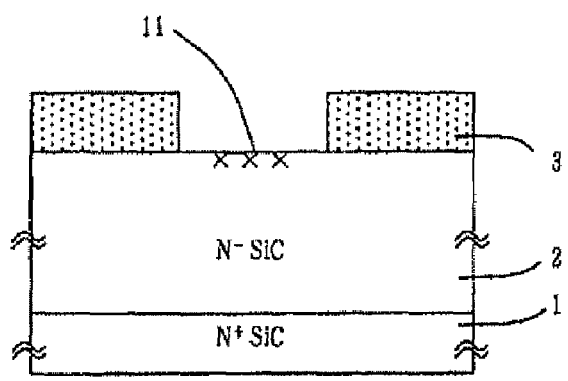

Next, as shown in FIG. 6B, a portion of the first hetero semiconductor region 3 not covered by the first mask layer 10 is etched through, for example, a reactive ion-etching (dry-etching) process. After this, the first mask layer 10 is removed as shown in FIG. 6C through a wet-etching process by using a mixture solution of ammonium fluoride and hydrogen fluoride.

Figure 6D:
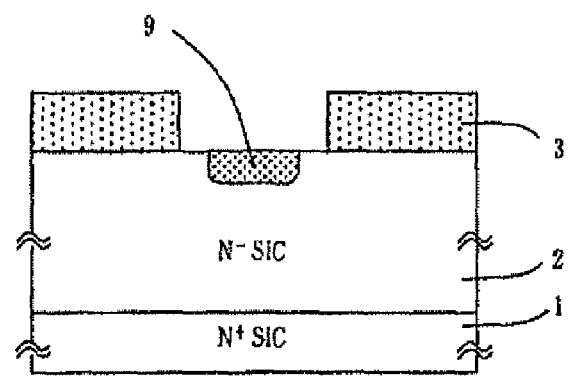

Next, as shown in FIG. 6D, the first impurity region 11 is activated through a predetermined thermal-treatment process, thereby forming the electric field alleviation region 9.

Finally, similar to the first exemplary embodiment, the process depicted in FIG. 3C is performed to complete the semiconductor device of FIG. 1.

Thus, the electric field alleviation region 9 can be formed to be spaced apart from an end of the first hetero semiconductor region 3 by a predetermined distance without using a sacrificial oxidation of the first hetero semiconductor region 3 (as described in the first to third exemplary embodiments). Further, the fourth exemplary embodiment can achieve the same effects as the first exemplary embodiment.

A method of manufacturing a semiconductor device according to a fifth exemplary embodiment is next described with reference to FIGS. 7, 8A-8D and 9A-9C. A description of the like elements between the first and fifth embodiments is omitted in the description of the fifth exemplary embodiment.

Figure 7:
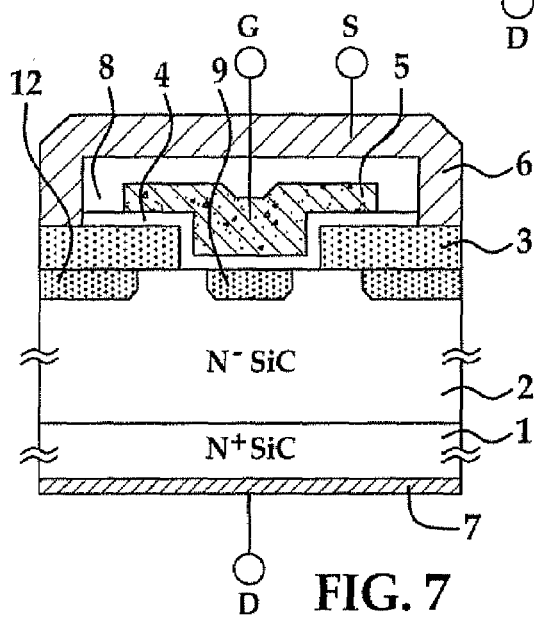
FIG. 7 is a cross-sectional view of a semiconductor device constructed in accordance with a fifth exemplary embodiment.

FIG. 7 illustrates a semiconductor device manufactured by a method according to the fifth exemplary embodiment. As can be seen, a semiconductor device according to the fifth exemplary embodiment is similar to the semiconductor device according to the first exemplary embodiment. However, unlike the first exemplary embodiment, in the fifth exemplary embodiment a second electric field region 12 is further formed in the drift region 2 such that it is adjacent to the first hetero semiconductor region 3 and spaced apart from the heterojunction driving end by a predetermined distance.

Thus, similar to the first exemplary embodiment, the electric field alleviation region 9 reducing the leakage current can be formed through self-alignment at a portion spaced apart from the heterojunction driving end to which the gate electric field is applied by a predetermined distance. Therefore, the on-resistance can be enhanced, and the leakage current can be reduced. In addition, by forming the second electric field alleviation region 12, an area of the heterojunction of the first hetero semiconductor region 3 and the drift region 2 is reduced. As such, in the current interruption state, the leakage current through the heterojunction can be further reduced compared to the semiconductor device of the first exemplary embodiment.

FIGS. 8A-8D and 9A-C illustrate a method of manufacturing the semiconductor device of FIG. 7.

Figure 8A:
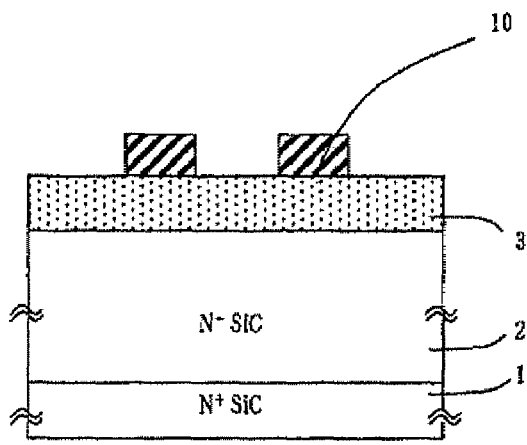
FIGS. 8A-8D illustrate processes of manufacturing the semiconductor device of FIG. 7.
Figure 8B:
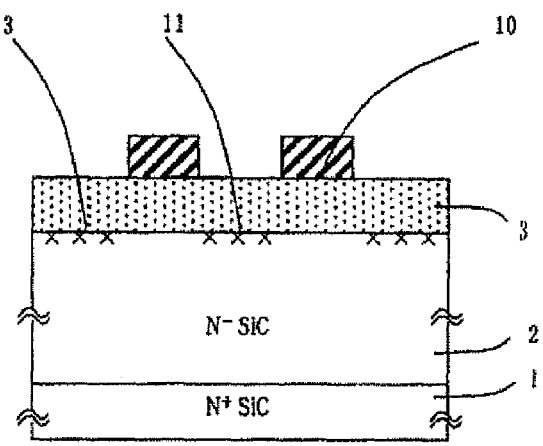

Referring now to FIG. 8A, a first mask layer 10 is formed on the first hetero semiconductor region 3 by patterning, for example, a CVD oxide layer through photolithography after performing the process of FIG. 2A of the first exemplary embodiment.

Next, as shown in FIG. 5B, first and second impurity regions 11 and 13 are formed in the drift region 2 by implanting impurities such as boron or aluminum in a portion of the drift region 2 through, for example, an ion implantation process when the first hetero semiconductor region 3 is disposed between the first mask layer 10 and the drift region 2.

Figure 8C:
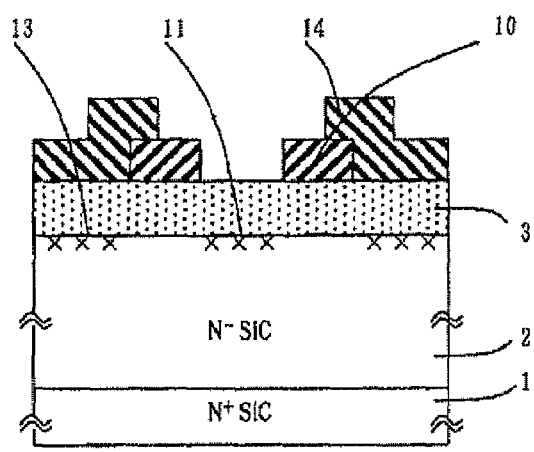

Next, as shown in FIG. 8C, a second mask layer 14 is formed to cover a portion of the first hetero semiconductor region 3 not covered by the first mask layer 10 and corresponding to the second impurity region 13 (hereinafter referred to as "an electric field alleviation region 12"). In the fifth exemplary embodiment, a material of the second mask layer 14 is different from that of the first mask layer 10 so that it can be easily patterned. However, even when the material of the second mask layer 14 is identical to that of the first mask layer 10, the structure of FIG. 8C can be obtained by varying a thickness thereof or by using a heat-treatment condition.

Figure 8D:
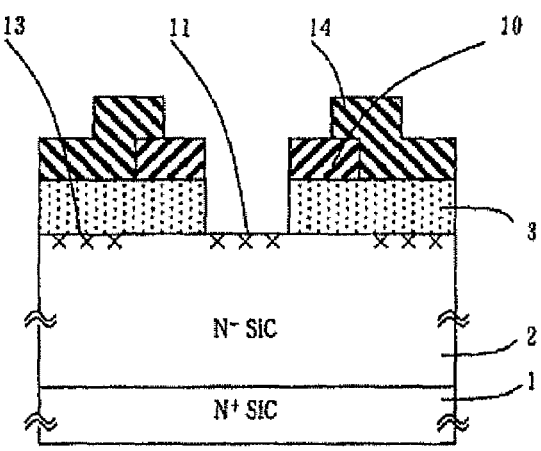

Next, as shown in FIG. 8D, a portion of the first hetero semiconductor region 3 not covered by either the first mask layer 10 or the second mask layer 14 is etched through, for example, a reactive ion etching (dry-etching) process.

Figure 9A:
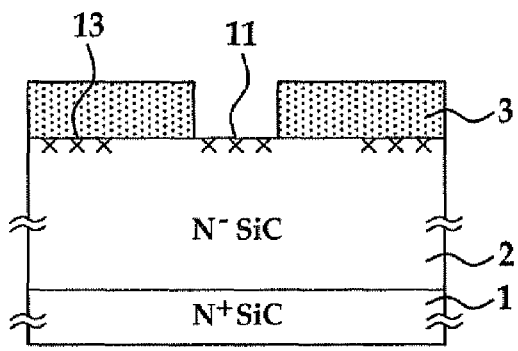
FIGS. 9A-9C illustrate processes subsequent to the processes of FIGS. 8A-8D.

After the above, as shown in FIG. 9A, the second mask layer 14 is removed by a mixture solution of sulfuric acid and hydrogen peroxide, after which the first mask layer 10 is removed through a wet-etching process by using a mixture solution of ammonium fluoride and hydrogen fluoride. Of course, other methods of removal of each layer 10, 14 are possible.

Figure 9B:
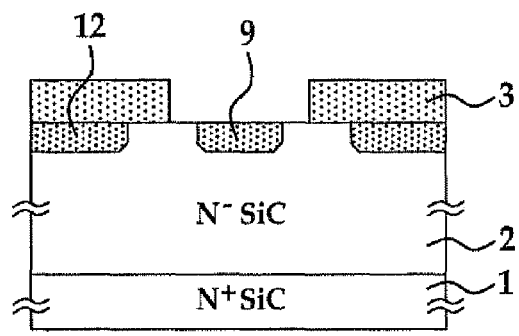

Next, as shown in FIG. 9B, a portion of the hetero semiconductor region 3 is oxidized with a predetermined thickness through, for example, a dry $O_2$ oxidizing process. At the same time, the first and second impurity regions 11 and 13 are activated to form the electric field alleviation region 9 under the gate electrode and the electric field alleviation region 12 under the source region, respectively.

In the fifth exemplary embodiment, a depth of the electric field alleviation region 9 under the gate electrode is the same as that of the electric field alleviation region 12 under the source region.

Next, the oxidized portion of the first hetero semiconductor region 3 is isotropically etched through a wet-etching process by using ammonium fluoride and hydrogen fluoride, for example.

Figure 9C:
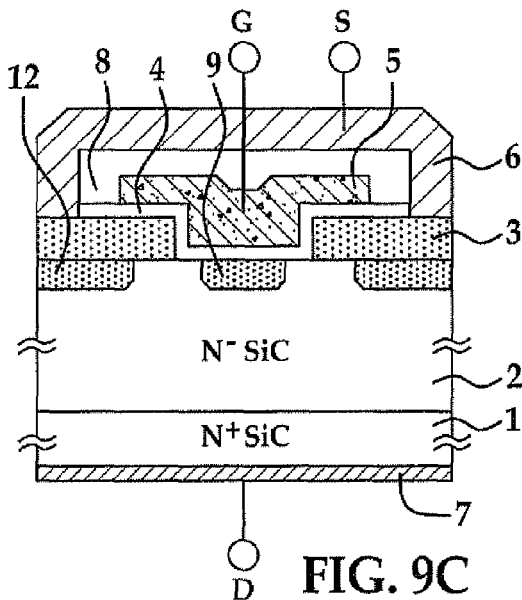

Finally, as shown in FIG. 9C, the gate insulation layer 4 and the polycrystalline silicon layer are consecutively formed on a portion of the drift region 2 exposed by the arrangement of the first hetero semiconductor region 3. The gate insulation layer 4 and the polycrystalline silicon layer are formed, through, for example, an LP-CVD process. Further, impurities such as phosphor or arsenic are implanted in the polycrystalline silicon layer through, for example, an ion implantation process, thereby forming the N-type gate electrode 5.

Further, the gate electrode 5 is patterned by using a mask layer, and an interlayer dielectric 8 is formed on the gate insulation layer 4 and the gate electrode 5 through, for example, a CVD process.

In addition, the drain electrode 7 is formed of, for example, titanium and nickel, on a surface of the substrate region 1 that faces the junction of the drift region 2 and the substrate region 1. Regardless of the order, the source electrode 6 can be formed of, for example, titanium and aluminum, to contact the interlayer dielectric 8, the gate insulation layer 4 and the first hetero semiconductor region 3. Thus, the semiconductor device according to the fifth exemplary embodiment of FIG. 7 is completed.

As described above, in the semiconductor device of the fifth exemplary embodiment, all of the heterojunction driving end, the electric field alleviation region 9 under the gate electrode and the electric field alleviation region 12 under the source region 12 are formed by using the first mask layer 10 through the thermal oxidizing process that can easily control the thickness. Thus, they can be formed with an optimal distance from each other.

Further, when the semiconductor device is designed to have a plurality of such unit cells, distances between the heterojunction driving end, the field alleviation region 9 under the gate electrode and the electric field alleviation region 12 under the source region are uniformly defined in all of the unit cells, thereby improving reliability.

Since a variation does not easily occur in the surface in the current interruption state and the current conduction state, the reliability and basic performance of the semiconductor device designed to have the plurality of the unit cells can be improved.

A method of manufacturing a semiconductor device in accordance with a sixth exemplary embodiment is next described with reference to FIGS. 10 and 11A-11C. In the fifth and sixth exemplary embodiments, like reference numerals refer to like elements. Accordingly, a description of the like elements are omitted in the description of the sixth exemplary embodiment.

Figure 10:
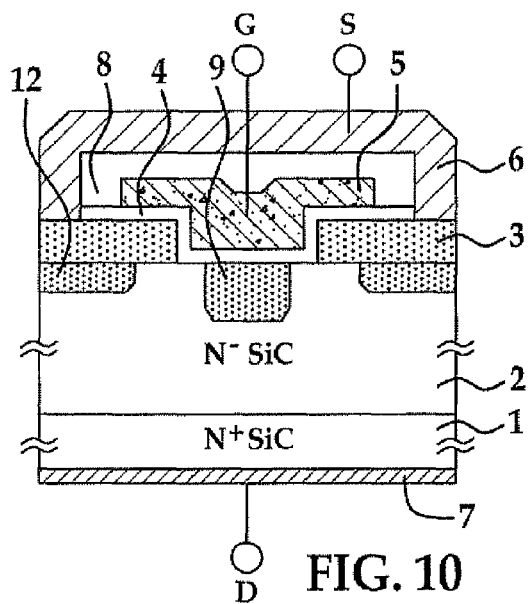
FIG. 10 is a cross-sectional view of a semiconductor device constructed in accordance with a sixth exemplary embodiment.

FIG. 10 illustrates a semiconductor device manufactured by a method according to the sixth exemplary embodiment. As shown in FIG. 10, this semiconductor device is similar to the semiconductor device of the fifth exemplary embodiment. However, in the sixth exemplary embodiment, the electric field alleviation region 9 under the gate electrode is deeper than the electric field alleviation region 12 under the source region.

The sixth exemplary embodiment can achieve the same effects as the fifth exemplary embodiment. Further, as a depth of the electric field alleviation region 9 under the gate electrode is different from that of the electric field alleviation region 12 under the source region, either the driving performance in the current conduction state or the leakage current reduction effect in the current interruption state can be improved.

Figure 11A:
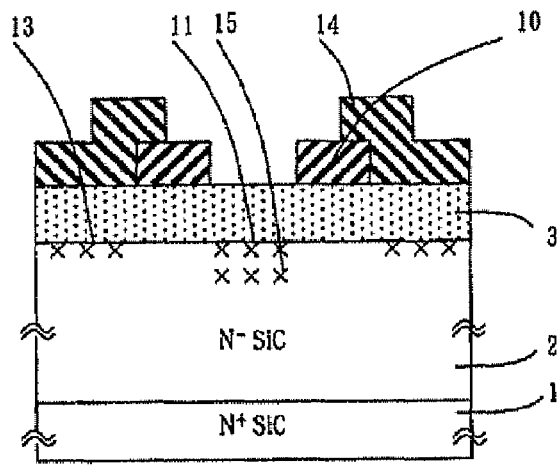
FIGS. 11A-11C illustrate processes of manufacturing the semiconductor device of FIG. 10.
Figure 11B:
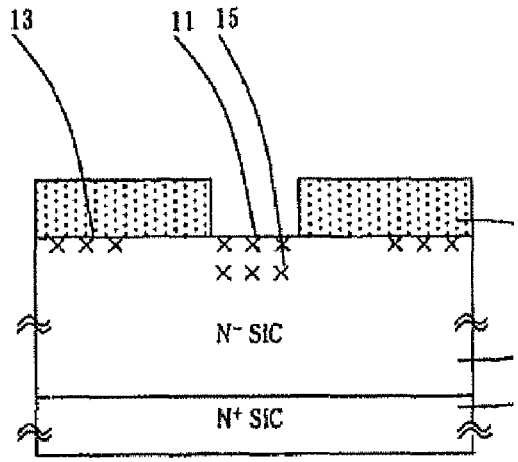
Figure 11C:
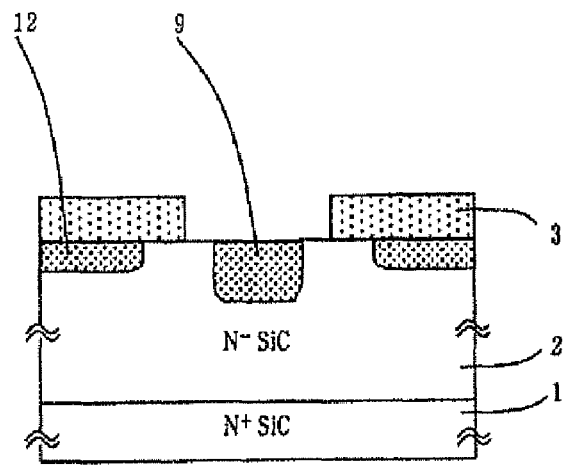

FIGS. 11A-11C illustrate a method of manufacturing the semiconductor device of FIG. 10.

Referring now to FIG. 11A, a third impurity region 15 is further formed in the drift region 2 by implanting impurities such as boron or aluminum in a portion of the drift region 2 that is not covered by the second mask layer 14 and is deeper than the first impurity region 11. The third impurity region 15 is formed by, for example, an ion implantation process when the first hetero semiconductor region 3 is disposed between the second mask layer 14 and the drift region 2.

Next, as shown in FIG. 11B, a portion of the first hetero semiconductor region 3 not covered by either the first mask layer 10 or the second mask layer 14 is etched through, for example, a reactive ion etching (dry-etching) process.

After the above, the second mask layer 14 is removed by a mixture solution of sulfuric acid and hydrogen peroxide, after which the first mask layer 10 is removed through a wet-etching process by using a mixture solution of ammonium fluoride and hydrogen fluoride. Other processes for removal can also be used.

Next, as shown in FIG. 11C, a portion of the hetero semiconductor region 3 is oxidized with a predetermined thickness through, for example, a dry $O_2$ oxidizing process. At the same time, the first, second and third impurity regions 11, 13, 15 are activated to form the electric field alleviation region 9 under the gate electrode and the electric field alleviation region 12 under the source region. In the sixth exemplary embodiment, since the third impurity region 15 is formed, the depth of the electric field alleviation region 9 under the gate electrode becomes greater than that of the electric field alleviation region 12 under the source region.

The oxidized portion of the first hetero semiconductor region 3 is next isotropically etched through a wet-etching process by using ammonium fluoride and hydrogen fluoride, for example.

Finally, similar to the fifth exemplary embodiment, the process of FIG. 9C is performed to complete the semiconductor device of the sixth exemplary embodiment.

By performing the above-described processes, the electric field alleviation region 9 under the gate electrode and the electric field alleviation region 12 under the source region can be formed at locations spaced apart from the first hetero semiconductor region 3 by a predetermined distance. Further, the electric field alleviation region 9 under the gate electrode can be formed to be deeper than the electric field alleviation region 12 under the source region.

The following describes a method of a semiconductor device according to a seventh exemplary embodiment with reference to FIGS. 12, 13A-13D and 14A-14C. In the fifth and seventh embodiments, like reference numerals refer to like elements, and a description of the like elements is omitted in the description of the seventh exemplary embodiment.

Figure 12:
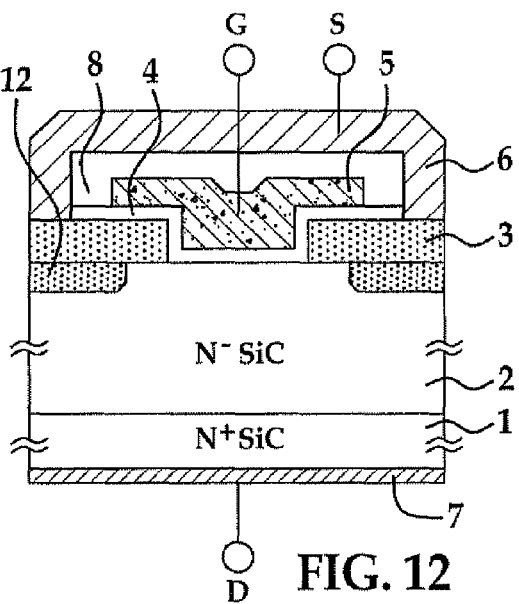
FIG. 12 is a cross-sectional view of a semiconductor device constructed in accordance with a seventh exemplary embodiment.

A semiconductor device manufactured by a method of the seventh exemplary embodiment is described with reference to FIG. 12. As shown in FIG. 12, a semiconductor device according to the seventh exemplary embodiment is similar to the semiconductor device according to the fifth exemplary embodiment. However, in the seventh exemplary embodiment, the electric field alleviation region 9 under the gate electrode is not formed. As the electric field alleviation region 9 is not formed under the gate electrode 5, a width of the gate electrode 5 can be further reduced. Accordingly, the integration of the semiconductor device can be improved.

A method of manufacturing the semiconductor device of FIG. 12 in accordance with the seventh exemplary embodiment is next described with references to FIGS. 13A-13D and 14A-14C.

Figure 13A:
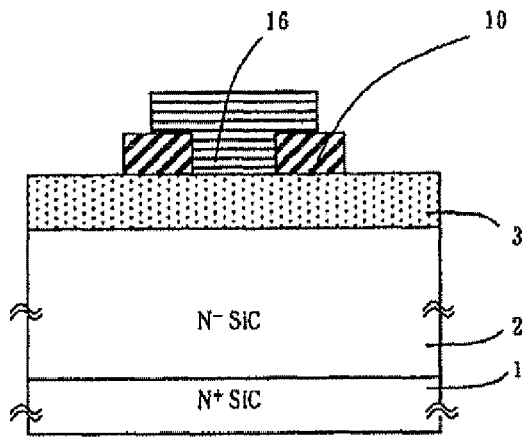
FIGS. 13A-13D illustrate processes of manufacturing the semiconductor device of FIG. 12.

Referring now to FIG. 13A, a third mask layer 16 (e.g., a resist mask) is formed on a portion of the first hetero semiconductor region 3 that is not covered by the first mask layer 10 and does not correspond to the electric field alleviation region 12 under the source region.

In the seventh exemplary embodiment, a material of the third mask layer 16 is different from that of the first mask layer 10. Thus, the third mask layer 16 can be easily patterned. However, even when the material of the third mask layer 16 is identical to that of the first mask layer 10, the structure of FIG. 13A can be obtained by varying its thickness or by using a heat-treatment condition.

Figure 13B:
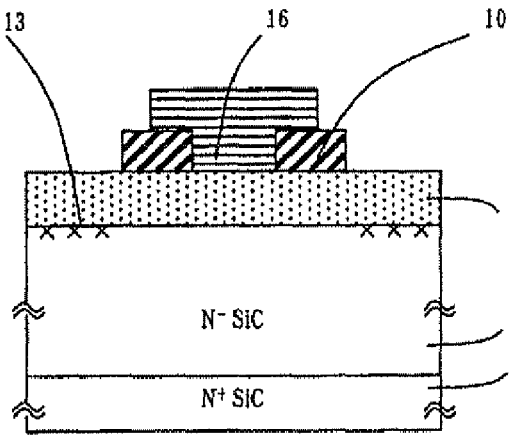

Next, as shown in FIG. 13B, the second impurity region 13 is formed in the drift region 2 by implanting impurities such as boron or aluminum through a portion of the first hetero semiconductor region 3 not covered by the first mask layer 10 or the third mask layer 16. The second impurity region 12 can be formed through, for example, an ion implantation process.

Figure 13C:
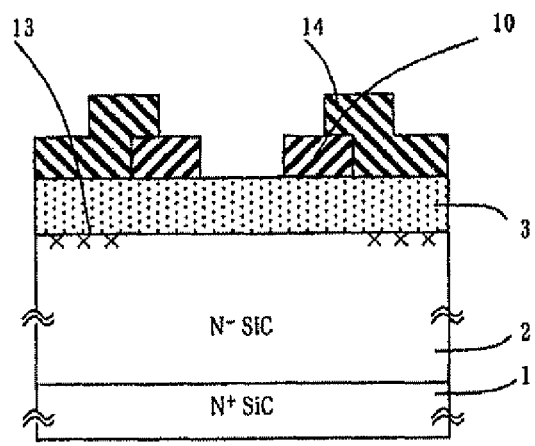

Next, as shown in FIG. 13C, the third mask layer 16 is removed by a mixture solution of, for example, sulfuric acid and hydrogen peroxide.

After the above, a second mask layer 14 (a resist mask) is formed to cover a portion of the first hetero semiconductor region 3 that is not covered by the first mask layer 10 and corresponds to the second impurity region 13 (hereinafter referred to as "an electric field alleviation region 12"). A material of the second mask layer 14 is different from that of the first mask layer 10 so that it can be easily patterned. However, even when the material of the second mask layer 14 is identical to that of the first mask layer 10, the structure of FIG. 13C can be obtained by varying material thickness or by using a heat-treatment condition.

Figure 13D:
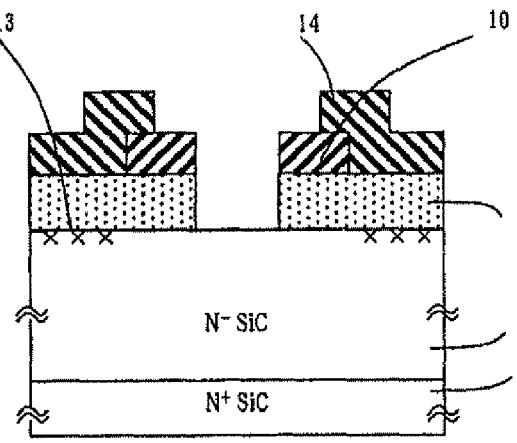

Next, as shown in FIG. 13D, a portion of the first hetero semiconductor region 3 not covered by the first mask layer 10 or the second mask layer 14 is etched through, for example, a reactive ion etching (dry-etching) process.

Figure 14A:
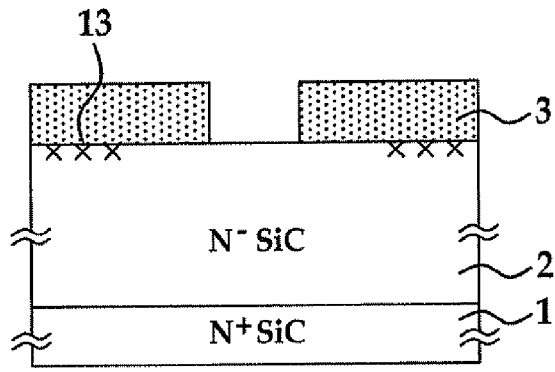
FIGS. 14A-14C illustrate processes subsequent to the processes of FIGS. 13A-13D.

After the above, as shown in FIG. 14A, the second mask layer 14 is removed by a mixture solution of sulfuric acid and hydrogen peroxide, after which the first mask layer 10 is removed through a wet-etching process by using a mixture solution of ammonium fluoride and hydrogen fluoride. Other processes for removing the mask layers 10, 14 are also possible.

Figure 14B:
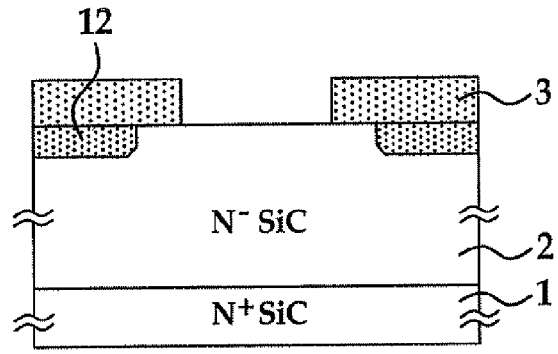

Next, as shown in FIG. 14B, a portion of the hetero semiconductor region 3 is oxidized with a predetermined thickness through, for example, a dry $O_2$ oxidizing process. At the same time, the first and second impurity regions 11 and 13 are activated to form the electric field alleviation region 12 under the source region. The oxidized portion of the first hetero semiconductor region 3 is isotropically etched through, for example, a wet-etching process using ammonium fluoride and hydrogen fluoride.

Figure 14C:
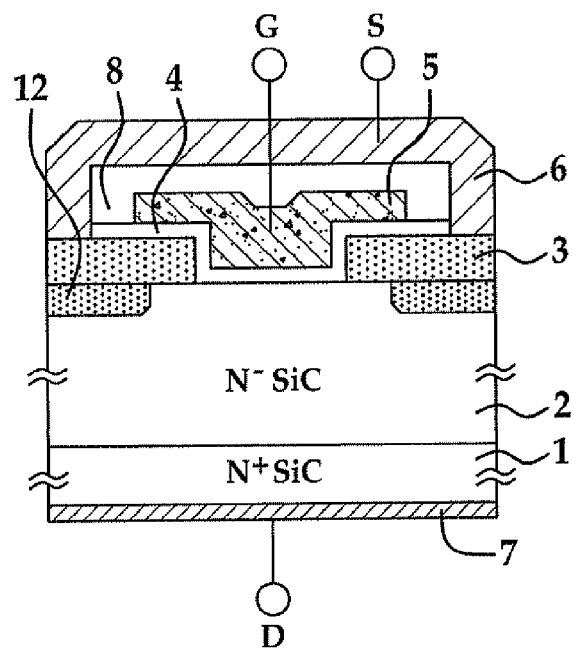

Finally, as shown in FIG. 14C, the gate insulation layer 4 and the polycrystalline silicon layer are consecutively formed on a portion of the drift region 2 exposed by the arrangement of the first hetero semiconductor region 3. The gate insulation layer 4 and the polycrystalline silicon layer are formed through, for example, an LP-CVD process.

Further, impurities such as phosphor or arsenic are implanted in the polycrystalline silicon layer through, for example, an ion implantation process, thereby forming the N-type gate electrode 5. The gate electrode 5 is patterned by using a mask layer. Also, an interlayer dielectric 8 is formed on the gate insulation layer 4 and the gate electrode 5 through, for example, a CVD process.

The drain electrode 7 is formed of, for example, titanium and nickel, on the other surface of the substrate region 1.

Regardless of the order, the source electrode 6 is formed of, for example, titanium and aluminum, and contacts the interlayer dielectric 8, the gate insulation layer 4 and the first hetero semiconductor region 3. Thus, the semiconductor device according to the seventh exemplary embodiment of FIG. 12 is completed.

As described above, in the semiconductor device of the seventh exemplary embodiment, both the heterojunction driving end and the electric field alleviation region 12 under the source region 12 are formed by using the first mask layer 10 through a thermal oxidizing process that can easily control the thickness. Thus, they can be formed with an optimal distance from each other. As such, even when the semiconductor device is designed to have a plurality of such unit cells, distances between the heterojunction driving end and the electric field alleviation region 12 under the source region are uniformly defined in all of the unit cells.

As a result, since an change does not easily occur in the surface in the current interruption state and the current conduction state, the reliability and basic performance of the semiconductor device designed to have the plurality of the unit cells can be improved.

The following describes a method of a semiconductor device according to an eighth exemplary embodiment with reference to FIGS. 15 and 16A-16C. In the fifth and eighth exemplary embodiments, like reference numerals refer to like elements. In addition, a description of the like elements is omitted in the description of the eighth exemplary embodiment.

Figure 15:
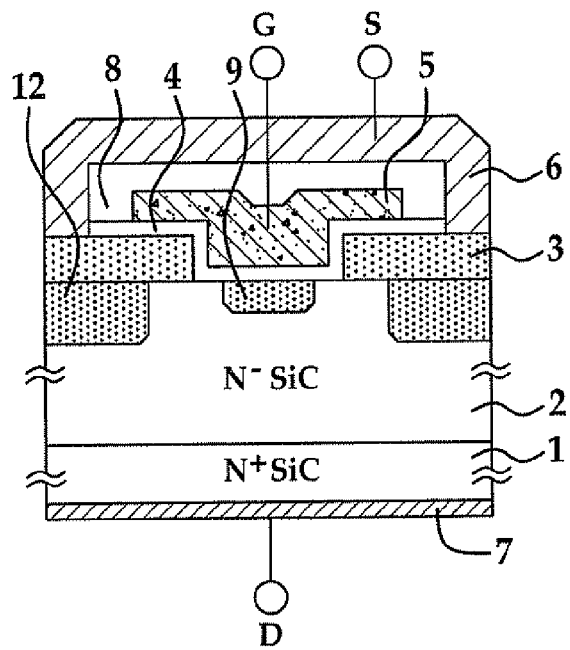
FIG. 15 is a cross-sectional view of a semiconductor device constructed in accordance with an eighth exemplary embodiment.

A semiconductor device manufactured by a method of the eighth exemplary embodiment is now described with reference to FIG. 15. As shown in FIG. 15, a semiconductor device of the eighth exemplary embodiment is similar to the semiconductor device of the fifth exemplary embodiment. However, in the eighth exemplary embodiment, the electric field alleviation region 9 under the gate electrode is shallower than the electric field alleviation region 12 under the source region. The eighth exemplary embodiment can achieve the same effects as the fifth exemplary embodiment.

Figure 16A:
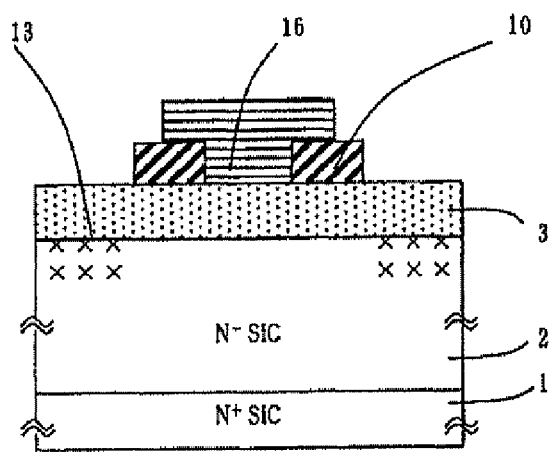
FIG. 16A-16C illustrate processes of manufacturing the semiconductor device of FIG. 15.
Figure 16B:
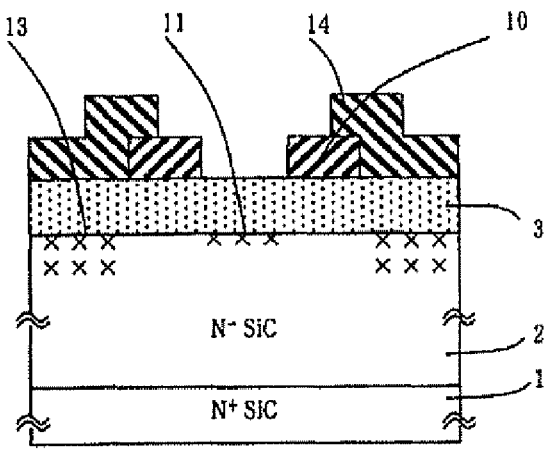
Figure 16C:
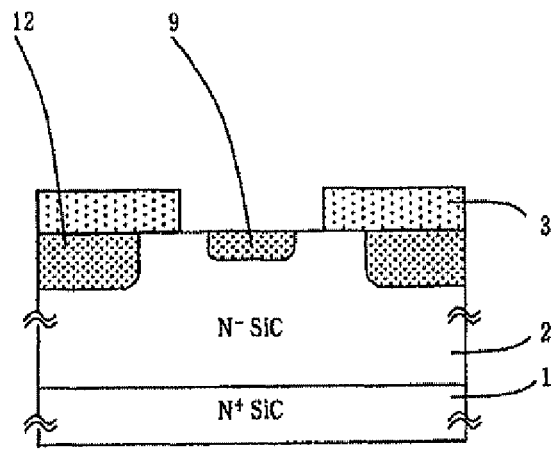

A method of manufacturing the semiconductor device in accordance with the eighth exemplary embodiment of FIG. 15 is next described with respect to FIGS. 16A-16C.

Referring now to FIG. 16A, a third mask layer 16 (e.g., a resist mask) is formed on a portion of the first hetero semiconductor region 3 that is not covered by the first mask layer 10 and does not correspond to the electric field alleviation region 12 under the source region. In the eighth exemplary embodiment, a material of the third mask layer 16 is different from that of the first mask layer 10 so that the third mask layer 16 can be easily patterned. However, even when the material of the third mask layer 16 is identical to that of the first mask layer 10, the structure of FIG. 16A can be obtained by varying material thickness or by a heat-treatment condition.

Next, the second impurity region 13 is formed in the drift region 2 by implanting impurities such as boron or aluminum through a portion of the first hetero semiconductor region 3 not covered by the first mask layer 10 or the third mask layer 16. The second impurity region 13 is formed through, for example, an ion implantation process.

Next, as shown in FIG. 16B, the third mask layer 16 is removed by a mixture solution of, for example, sulfuric acid and hydrogen peroxide.

After the above, a second mask layer 14 (a resist mask) is formed to cover a portion of the first hetero semiconductor region 3 that is not covered by the first mask layer 10 and that corresponds to the second impurity region 13 (hereinafter referred to as "an electric field alleviation region 12 under the source region"). A material of the second mask layer 14 is different from that of the first mask layer 10 so that it can be easily patterned. However, even when the material of the second mask layer 14 is identical to that of the first mask layer 10, the structure of FIG. 16B can be obtained by varying thickness or a heat-treatment condition.

Next, the first impurity region 11 is formed in the drift region 2 by implanting impurities such as boron or aluminum through a portion of the first hetero semiconductor region 3 not covered by the first mask layer 10 or the second mask layer 14. The first impurity region 11 is formed through, for example, an ion implantation process.

Accordingly, in the eighth exemplary embodiment the third impurity region 13 is formed to be deeper than the first impurity region 11.

As shown in FIG. 16C, a portion of the first hetero semiconductor region 3 not covered by the first mask layer 10 or the second mask layer 14 is etched through, for example, a reactive ion etching (dry-etching) process.

After the above, the second mask layer 14 is removed by a mixture solution of sulfuric acid and hydrogen peroxide, after which the first mask layer 10 is removed through a wet-etching process by using a mixture solution of ammonium fluoride and hydrogen fluoride. Other processes for removal of the mask layers 10, 14 are also possible.

Next, a portion of the hetero semiconductor region 3 is oxidized with a predetermined thickness through, for example, a dry $O_2$ oxidizing process. At the same time, the first and second impurity regions 11 and 13 are activated to form the electric field alleviation region 9 under the gate electrode and the electric field alleviation region 12 under the source region. The oxidized portion of the first hetero semiconductor region 3 is isotropically etched through, for example, a wet-etching process using ammonium fluoride and hydrogen fluoride.

Finally, similar to the fifth exemplary embodiment, the process of FIG. 9C is performed to complete the semiconductor device of FIG. 15, which is in accordance with the eighth exemplary embodiment taught herein.

As described above, according to the method of manufacturing the semiconductor device in accordance with the eighth exemplary embodiment, the electric field alleviation region 9 is shallower than the electric field alleviation region 12 and can be formed through self-alignment. Further, the eighth exemplary embodiment can achieve the same effects as the fifth exemplary embodiment.

Also, the above-described embodiments have been described in order to allow easy understanding of the invention and do not limit the invention. On the contrary, the invention is intended to cover various modifications and equivalent arrangements included within the scope of the appended claims.

For example, in the first to eighth exemplary embodiments, a transistor structure having a basic configuration is illustrated to easily describe the features of the invention. However, the invention is not limited to such a structure. Any additional structures can be added to the semiconductor device, or other structures of the semiconductor device can be modified.

Figure 17:
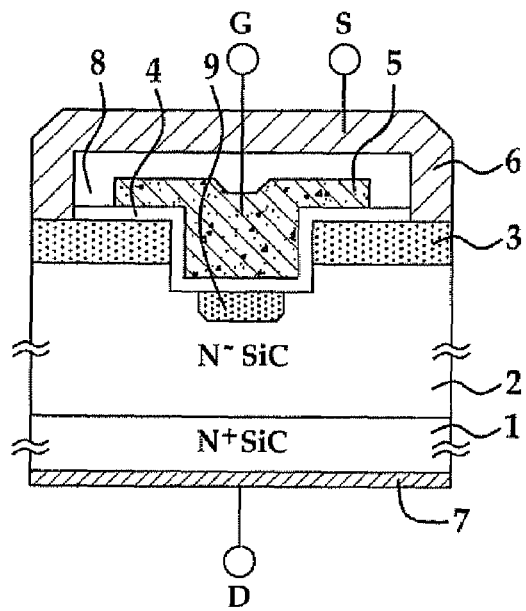
FIG. 17 is a cross-sectional view of a modified example of a semiconductor device constructed in accordance with the teachings herein.
Figure 18:
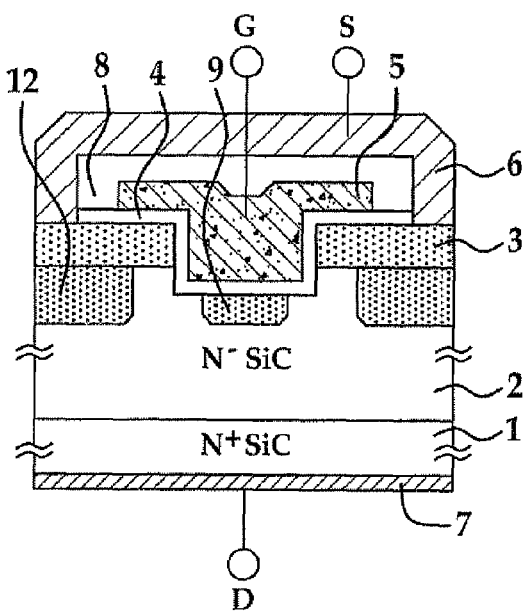
FIG. 18 is a cross-sectional view of another modified example of a semiconductor device constructed in accordance with the teachings herein.
Figure 19:
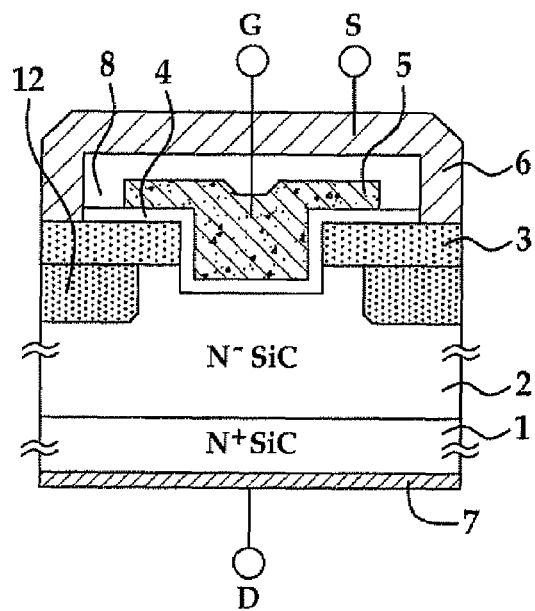
FIG. 19 is a cross-sectional view of yet another modified example of a semiconductor device constructed in accordance with the teachings herein.

More specifically, the semiconductor device may be designed as shown in FIGS. 17 to 19. The semiconductor devices of FIGS. 17 to 19 are designed by using the configurations of the first, fifth and seventh exemplary embodiments, respectively.

As shown in FIGS. 17 to 19, a gate insulation layer 4 is formed to contact a groove formed on the drift region 2, and a gate electrode 5 is formed on the gate insulation layer 4. The semiconductor devices depicted in FIGS. 17 to 19 can achieve the same effects as those of the semiconductor devices according to the first, fifth and seventh exemplary embodiments, respectively.

As described in the fourth exemplary embodiment, the semiconductor devices depicted in FIGS. 17 to 19 can be effectively manufactured by dry-etching a surface of the drift region 2 and the first hetero semiconductor region 3 after enlarging an aperture of the first mask layer 10 through an isotropic-etching process.

Figure 20:
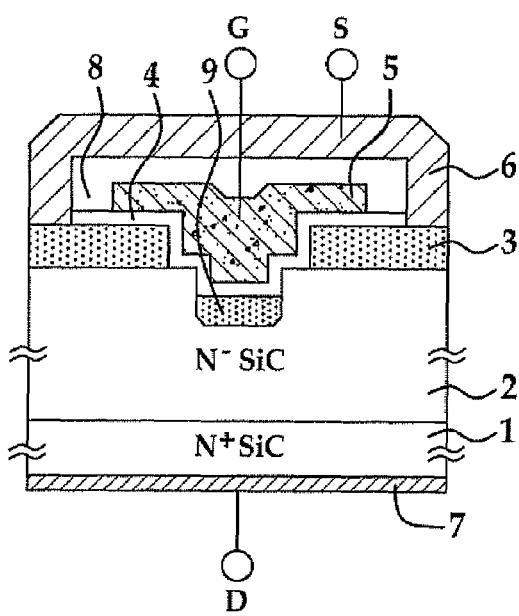
FIG. 20 is a cross-sectional view of still yet another modified example of a semiconductor device constructed in accordance with the teachings herein.
Figure 21:
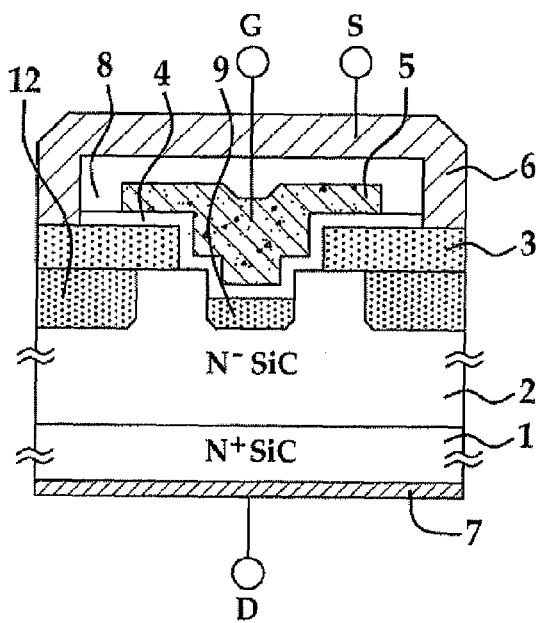
FIG. 21 is a cross-sectional view of still yet another modified example of a semiconductor device constructed in accordance with the teachings herein.
Figure 22:
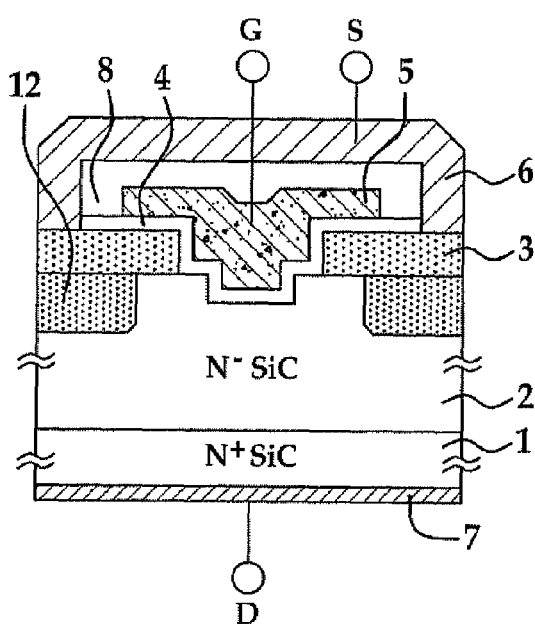
FIG. 22 is a cross-sectional view of still yet another modified example of a semiconductor device constructed in accordance with the teachings herein.

Further, the semiconductor device may be designed as shown in FIGS. 20 to 22. The semiconductor devices of FIGS. 20 to 22 are designed by using the configurations of the first, fifth and seventh exemplary embodiments, respectively.

In the semiconductor devices of FIGS. 20 to 22, the groove formed on the drift region 2 is spaced apart from the heterojunction driving end, and the gate insulation layer 4 is formed to contact the groove and the heterojunction driving end. In addition, the gate electrode 5 is formed on the gate insulation layer 4.

The semiconductor devices depicted in FIGS. 20 to 22 can achieve the same effects as those of the semiconductor devices according to the first, fifth and seventh exemplary embodiments, respectively.

In addition, the semiconductor devices depicted in FIGS. 20 to 22 can be easily manufactured by using the process of FIG. 3A in which the surface of the drift region 2 and the first hetero semiconductor region 3 are dry-etched, after when the end of the first hetero semiconductor region 3 is retracted by the sacrificing oxidation.

Figure 23:
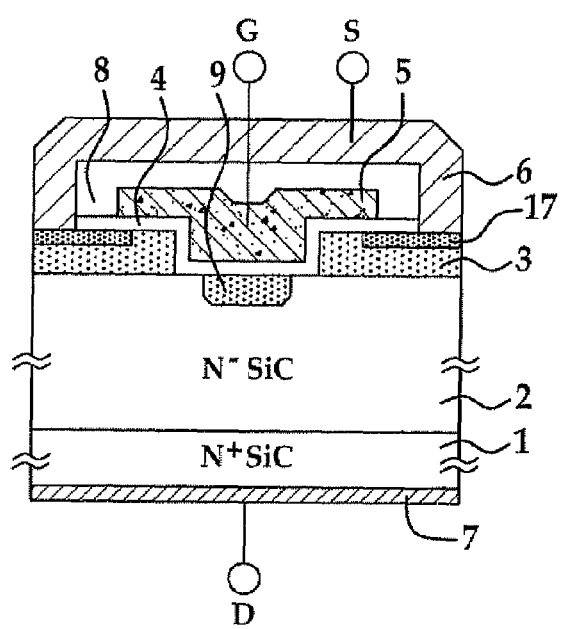
FIG. 23 is a cross-sectional view of still yet another modified example of a semiconductor device constructed in accordance with the teachings herein.
Figure 24:
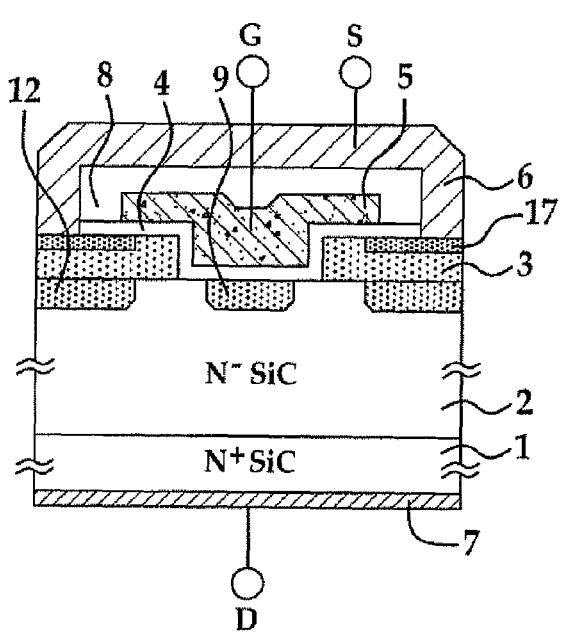
FIG. 24 is a cross-sectional view of still yet another modified example of a semiconductor device constructed in accordance with the teachings herein.
Figure 25:
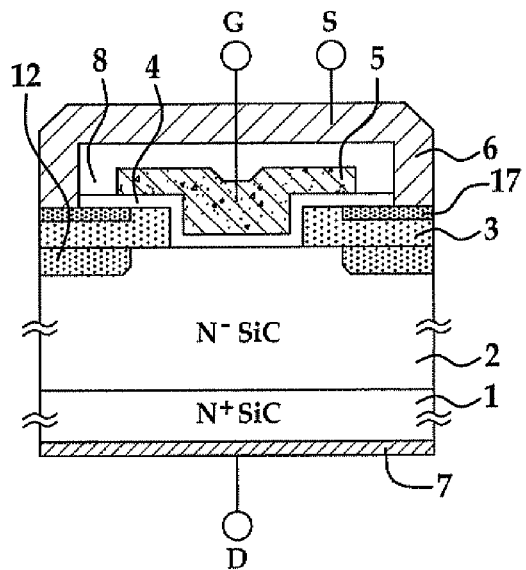
FIG. 25 is a cross-sectional view of still yet another modified example of a semiconductor device constructed in accordance with the teachings herein.

Further, the semiconductor device may be designed as shown in FIGS. 23 to 25. The semiconductor devices of FIGS. 23 to 25 are designed by using the configurations of the first, fifth and seventh exemplary embodiments, respectively.

In the semiconductor devices of FIGS. 23 to 25, the first hetero semiconductor region 3 is formed having different conductive-type regions and/or different density regions and has an N+-type second hetero semiconductor region 17 that ohmic-contacts the source electrode. The semiconductor devices depicted in FIGS. 23 to 25 can achieve the same effects as those of the semiconductor devices according to the first, fifth and seventh exemplary embodiments, respectively.

Further, in the semiconductor devices of FIGS. 23 to 25, the second hetero semiconductor region 17 is formed by implanting the impurities at a point where the first hetero semiconductor region 3 is formed. Alternatively, the second hetero semiconductor region 17 may be formed by impaling impurities after the gate electrode 5 is patterned.

As described above, the second hetero semiconductor region 17 can be easily formed.

Although the second hetero semiconductor region 17 is formed at a predetermined location and a predetermined depth in the semiconductor devices of FIGS. 23 to 25, the invention is not limited to this configuration. The second hetero semiconductor region 17 may be formed in a layered shape. Alternatively, the second hetero semiconductor region 17 may be locally formed in a line shape.

Figure 26:
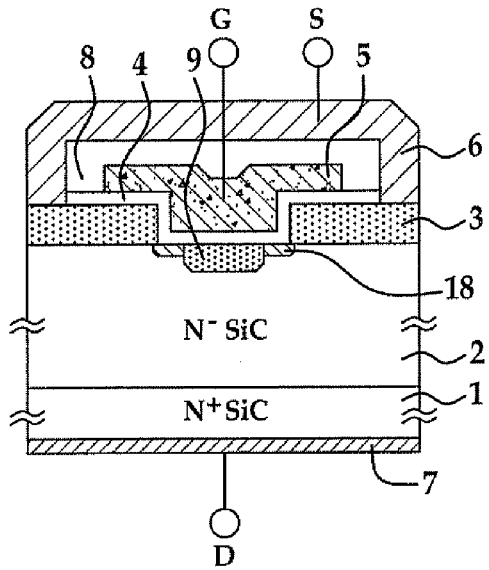
FIG. 26 is a cross-sectional view of still yet another modified example of a semiconductor device constructed in accordance with the teachings herein.
Figure 27:
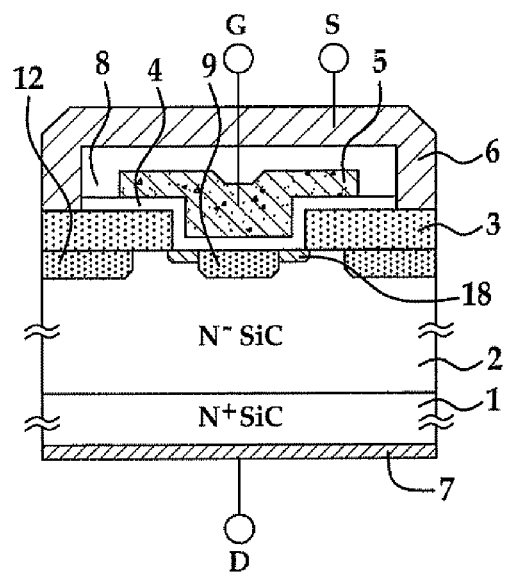
FIG. 27 is a cross-sectional view of still yet another modified example of a semiconductor device constructed in accordance with the teachings herein.
Figure 28:
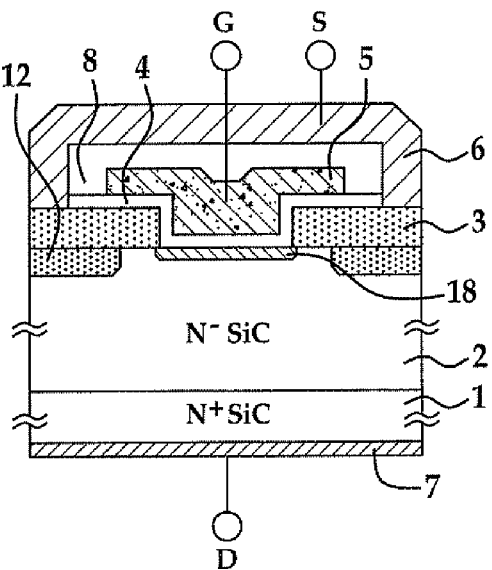
FIG. 28 is a cross-sectional view of still yet another modified example of a semiconductor device constructed in accordance with the teachings herein.

Further, the semiconductor device may be designed as shown in FIGS. 26 to 28. The semiconductor devices of FIGS. 26 to 28 are designed by using the configurations of the first, fifth and seventh exemplary embodiments, respectively. In the semiconductor devices of FIGS. 26 to 28, for example, an $N^+$-type conductive region 18 formed in the drift region 2 contacts the heterojunction driving end. Therefore, in the current conduction state, the current can flow under a lower resistance. In addition, the conductive region 18 may be formed by retracting the end of the first hetero semiconductor region 3 through a sacrificial oxidation. Thus, the semiconductor devices can be easily manufactured.

In all of the semiconductor devices of the first to eighth exemplary embodiments and the examples of FIGS. 17 to 28, the sidewall of the first hetero semiconductor region 3 is vertically formed. However, the invention is not limited to this configuration. That is, the sidewall of the first hetero semiconductor region 3 may be formed with a predetermined inclination.

Further, in the semiconductor devices of all of the exemplary embodiments, the semiconductor substrate is formed of silicon carbide. However, the invention is not limited to this configuration. The semiconductor device may be formed of other semiconductor materials such as gallium nitride, diamond and the like.

Further, in the semiconductor devices according to all of the exemplary embodiments, it is described that a poly type of the silicon carbide of the semiconductor region 1 is 4H. However, the invention is not limited to this configuration. The poly type of the semiconductor region 1 may be 6H, 3C and the like.

Also, in the semiconductor devices according to all of the exemplary embodiments, a longitudinal transistor where the source and drain electrodes 6 and 7 are disposed to face each other with the drift region 2 interposed therebetween, and the current flows in a longitudinal direction is described. However, the invention is not limited to this configuration. For example, a lateral transistor where the drain and source electrodes 7, 6 may be disposed on a same surface, and the current can flow in a lateral direction, is also contemplated herein.

Further, in the semiconductor devices according to all of the exemplary embodiments, the first hetero semiconductor region 3 is formed of polycrystalline silicon. However, the invention is not limited to this. That is, any material that can be hetero-adjoined with silicon carbide may be used. For example, other silicon materials such as mono-crystalline silicon and amorphous silicon, or other semiconductor materials such as germanium and silicon germanium, or silicon carbide of other poly types such as 6H and 3C may be used.

Also, in the semiconductor devices according to all of the exemplary embodiments, the heterojunction is formed with the drift region 2 formed of the N-type silicon carbide and the first hetero semiconductor region 3 formed of the N-type polycrystalline silicon. However, the invention is not limited to this configuration. That is, any combination of the N-type silicon carbide, P-type polycrystalline silicon, P-type silicon carbide, P-type poly crystalline silicon, P-type silicon carbide, N-type polycrystalline silicon may be possible.

In addition, in the semiconductor devices according to all of the exemplary embodiments, the conductive type of the substrate region 1 and the gate electrode 5 is the N-type. However, the invention is not limited to this configuration. That is, the conductive type may be a P-type.

In addition, in the semiconductor devices according to all of the exemplary embodiments, the first mask layer 10 is formed of a CVD oxide material. However, the invention is not limited to this configuration. That is, the first mask layer 10 may be formed of other materials such as photoresist layer and SiN.

In addition, the interlayer dielectric 8 may be formed of any material having at least an insulation property such as silicon oxide or SiN.

In addition, in the semiconductor devices according to all of the exemplary embodiments, the gate electrode 5 is formed of the polycrystalline silicon. However, the invention is not limited to this configuration. That is, any materials having a high electric conduction may be used for the gate electrode 5.

In addition, in the semiconductor devices according to all of the exemplary embodiments, the gate insulation layer 4 is formed of the silicon oxide. However, the invention is not limited to this configuration. That is, any materials having an insulation property may be used for the gate insulation layer.

In the semiconductor device manufacturing methods according to the first to eighth exemplary embodiments, after the polycrystalline silicon layer is formed on the N-type silicon carbide semiconductor substrate through, for example, the LP-CVD process, the N-type first hetero semiconductor region 3 is formed by implanting impurities such as phosphor and arsenic in the polycrystalline silicon layer through, for example, an ion-implantation process. However, the invention is not limited to this configuration. That is, the N-type hetero semiconductor region 3 may be formed through a laser annealing process after the polycrystalline silicon layer is formed through an electron beam deposition process or a sputtering process.

Alternatively, the N-type hetero semiconductor region 3 may be formed by using mono-crystalline silicon that is heteroepitaxial-grown by, for example, molecular line epitaxial.

In the semiconductor device manufacturing methods according to the first to eighth exemplary embodiments, the ion implanting process is used to form the first, second and/or third impurity regions 11, 13 and/or 15. However, the invention is not limited to this. That is, other methods that can implant the impurities in the drift region 2 such as a solid-state diffusion process may be used. Likewise, in the semiconductor device manufacturing methods according to the first to eighth exemplary embodiments, the ion implanting process is used to dope the impurities. However, the invention is not limited to this. For example, the solid-state diffusion process or the vapor deposition process may be used.

Further, in the semiconductor device manufacturing methods of the first to eighth exemplary embodiments, the first hetero semiconductor region 3 is etched through the dry-etching process. However, the invention is not limited to this. For example, a wet-etching process or a process of removing oxide layer by using a wet-etching using a mixture solution of ammonium fluoride and hydrogen fluoride after performing a thermal oxidizing process or a combination thereof may be used.

In the semiconductor device manufacturing methods according to the first to eighth exemplary embodiments, the first hetero semiconductor region 3 is oxidized through the dry $O_2$ oxidizing process. However, the invention is not limited to this configuration. For example, a wet oxidizing process, H2O oxidizing process, plasma oxidizing process and the like may be used.

In addition, in the semiconductor device manufacturing methods according to the first to eighth exemplary embodiments, the N-type gate electrode is formed by implanting impurities such as phosphor and arsenic in the polycrystalline silicon layer formed through, for example, the LP-CVD process. However, the invention is not limited to this configuration. That is, the N-type gate electrode 5 may be formed through a laser annealing process after the polycrystalline silicon layer is formed through an electron beam deposition process or a sputtering process. Alternatively, the N-type gate electrode 5 may be formed by using mono-crystalline silicon that is heteroepitaxial-grown by, for example, molecular line epitaxial.

Further, in the semiconductor device manufacturing methods according to the first to eighth exemplary embodiments, the LP-CVD process is used to form the gate insulation layer 4. However, the invention is not limited to this. Other processes such as a thermal oxidizing process or a plasma CVD process may be used.

Also, in the semiconductor device manufacturing methods according to the first to third exemplary embodiments, the oxidation of a portion of the hetero semiconductor region 3 and the activation of the first impurity region 11 are simultaneously performed. However, the invention is not limited to this. The oxidation and activation may be performed by different processes. Likewise, in the semiconductor device manufacturing methods according to the fifth, sixth and eighth exemplary embodiments, the oxidation of a portion of the hetero semiconductor region 3 and the activation of the first and second impurity regions 11 and 13 are simultaneously performed. However, the invention is not limited to this. The oxidation and activation may be performed by different processes.

Likewise, in the semiconductor device manufacturing methods according to the seventh exemplary embodiment, the oxidation of a portion of the hetero semiconductor region 3 and the activation of the second impurity region 13 are simultaneously achieved. However, the invention is not limited to this. The oxidation and activation may be performed by different processes.

In the semiconductor device manufacturing methods of the first to sixth exemplary embodiments and the eighth exemplary embodiment, although the electric field alleviation region 9 under the gate electrode is described as a P-type, the invention is not limited to this. For example, the electric field alleviation region 9 may be a high-resistance layer where the impurities are not activated and the resistance increases. In such a case, the impurities are not limited to boron or aluminum. That is, any impurities that can form an inactive layer such as vanadium may be used. In addition, an annealing process for the activation is not required.

Likewise, the electric field alleviation region 12 in the semiconductor devices of the fifth to eighth exemplary embodiments may be the high-resistance layer where the impurities are not activated and the resistance increases. In such a case, the impurities are not limited to boron or aluminum. That is, any impurities that can form an inactive layer such as vanadium may be used. In addition, an annealing process for the activation is not required.

In the semiconductor device manufacturing methods of the first to third exemplary embodiments and the fifth to eighth exemplary embodiments, the first mask member 10 is removed. Thus, the first hetero semiconductor region 3 is thermal-oxidized. However, the invention is not limited to this. That is, the first hetero semiconductor region 3 may be oxidized when the first mask layer 10 is not removed. In such a case, since the surface of the first hetero semiconductor region 3 that is covered by the first mask layer 10 is not easily oxidized, a layer thickness of the first hetero semiconductor region 3 can be maintained.

Further, although the third and fourth exemplary embodiments are described as different embodiments, these exemplary embodiments may be combined. For example, after a process of FIG. 6A, which enlarges the aperture of the first mask layer 10, is performed, the etching process of FIGS. 5A and 5B that leaves a portion of the first hetero semiconductor region 3 may be performed.

In the semiconductor device manufacturing methods according to the fifth, sixth and eighth exemplary embodiments, the semiconductor devices are manufactured by employing the method of the first exemplary embodiment. However, the invention is not limited to this. That is, the semiconductor devices according to the fifth, sixth and eighth exemplary embodiments are manufactured by employing the method of the third or fourth exemplary embodiment. In such a case, the fifth, sixth and eighth exemplary embodiments can achieve the same effect as the third and fourth exemplary embodiments.

According to the teachings herein, since the first electric field alleviation region reducing the leakage current is formed by self-alignment at a portion spaced apart from the heterojunction driving end to which the gate electric field is applied, the on-resistance can be improved, and the leakage current can be reduced.

Accordingly, the above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method of manufacturing a semiconductor device including a semiconductor substrate, a hetero semiconductor region formed of a semiconductor material having a band gap width different from that of the semiconductor substrate and hetero-adjoined with the semiconductor substrate, a gate insulation layer contacting the semiconductor substrate and a heterojunction of the hetero semiconductor region, a gate electrode formed on the gate insulation layer, a first electric field alleviation region spaced apart from a heterojunction driving end of the heterojunction that contacts the gate insulation layer by a predetermined distance, a source electrode contacting the hetero semiconductor region and a drain electrode contacting the semiconductor substrate, the method comprising:

forming a first mask layer on the hetero semiconductor region;

forming the first electric field alleviation region and the heterojunction driving end using at least a portion of the first mask layer, the first electric field alleviation region contacting the semiconductor substrate and the gate insulation layer and implanting impurities in a portion of the semiconductor substrate not covered by the first mask layer through an ion implantation process when the first electric field alleviation region is formed.

2. The method according to claim 1, further comprising:

performing a heat-treatment process of activating the impurities when the first electric field alleviation region is formed.

3. The method according to claim 1 wherein the semiconductor device further comprises a second electric field alleviation region that contacts the semiconductor substrate and the hetero semiconductor region and is spaced apart from the heterojunction driving end by a predetermined distance, the method further including:

forming the second electric field alleviation region using the first mask layer.

4. The method according to claim 3, further comprising:

forming a second mask layer on the hetero semiconductor region to cover the hetero semiconductor region contacting the second electric field alleviation region; and wherein forming the heterojunction driving end further includes forming the heterojunction driving end using both the first and second mask layers.

5. The method according to claim 4 wherein a material of the first mask layer is different from that of the second mask layer.

6. The method according to claim 1 wherein forming the heterojunction driving end further comprises:

forming the heterojunction driving end after at least a portion of the first mask layer is isotropically removed.

7. The method according to claim 1 wherein the semiconductor substrate comprises at least one of silicon carbide, diamond and gallium nitride.

8. The method according to claim 1 wherein the hetero semiconductor region comprises at least one of mono-crystalline silicon, polycrystalline silicon and amorphous silicon.

9. A method of manufacturing a semiconductor device including a semiconductor substrate, a hetero semiconductor region formed of a semiconductor material having a band gap width different from that of the semiconductor substrate and hetero-adjoined with the semiconductor substrate, a gate insulation layer contacting the semiconductor substrate and a heterojunction of the hetero semiconductor region, a gate electrode formed on the gate insulation layer, an electric field alleviation region spaced apart from a heterojunction driving end of the heterojunction that contacts the gate insulation layer by a predetermined distance, a source electrode contacting the hetero semiconductor region and a drain electrode contacting the semiconductor substrate, the method comprising:

forming a first mask layer on the hetero semiconductor region;

forming the electric field alleviation region and the heterojunction driving end by using at least a portion of the first mask layer, the electric field alleviation region contacting the semiconductor substrate and the hetero semiconductor region; and implanting impurities in a portion of the semiconductor substrate not covered by the first mask layer through an ion implantation process when the electric field alleviation region is formed.

10. The method according to claim 9, further comprising:

performing a heat-treatment process of activating the impurities when the electric field alleviation region is formed.

11. The method according to claim 10, further comprising:

performing a process of isotropically removing a portion of the semiconductor substrate covered by the first mask layer when the heterojunction driving end is formed.

12. The method according to claim 11 wherein performing the process of isotropically removing further comprises performing a sacrificial oxidation.

13. A method of manufacturing a semiconductor device including a semiconductor substrate, a hetero semiconductor region formed of a semiconductor material having a band gap width different from that of the semiconductor substrate and hetero-adjoined with the semiconductor substrate, a gate insulation layer contacting the semiconductor substrate and a heterojunction of the hetero semiconductor region, a gate electrode formed on the gate insulation layer, an electric field alleviation region spaced apart from a heterojunction driving end of the heterojunction that contacts the gate insulation layer by a predetermined distance, a source electrode contacting the hetero semiconductor region and a drain electrode contacting the semiconductor substrate, the method comprising:

forming a first mask layer on the hetero semiconductor region;

forming the electric field alleviation region and the heterojunction driving end by using at least a portion of the first mask layer, the electric field alleviation region contacting the semiconductor substrate and the hetero semiconductor region;

forming a third mask layer covering together with the first mask layer a portion of the hetero semiconductor region that does not contact the electric field alleviation region on the hetero semiconductor region; and forming a second mask layer covering a portion of the hetero semiconductor region that contacts the electric field alleviation region on the hetero semiconductor region; wherein forming the electric field alleviation region includes forming the electric field alleviation region using both the first and third mask layers; and wherein forming the heterojunction driving end further includes forming the heterojunction driving end using both the first and second mask layers.

14. The method according to claim 13 wherein at least one of a material of the second mask layer and a material of the third mask layer is different from a material of the first mask layer.

* * * * *